United States Patent
Gijsbertsen et al.

(10) Patent No.: US 12,535,314 B2
(45) Date of Patent: Jan. 27, 2026

(54) SYSTEM AND METHOD FOR GENERATING LEVEL DATA FOR A SURFACE OF A SUBSTRATE

(71) Applicant: ASML Netherlands B.V., Veldhoven (NL)

(72) Inventors: Arjan Gijsbertsen, Vught (NL); Viktor Trogrlic, Eindhoven (NL); Peter Fernand William Jozef Dendas, Koersel (BE); Mihaita Popinciuc, Eindhoven (NL); Andrey Valerievich Rogachevskiy, Den Bosch (NL)

(73) Assignee: ASML Netherlands B.V., Veldhoven (NL)

( * ) Notice: Subject to any disclaimer, the term of this patent is extended or adjusted under 35 U.S.C. 154(b) by 625 days.

(21) Appl. No.: 17/923,535

(22) PCT Filed: Mar. 29, 2021

(86) PCT No.: PCT/EP2021/058125
§ 371 (c)(1),
(2) Date: Nov. 4, 2022

(87) PCT Pub. No.: WO2021/223940
PCT Pub. Date: Nov. 11, 2021

(65) Prior Publication Data
US 2023/0204352 A1 Jun. 29, 2023

(30) Foreign Application Priority Data
May 4, 2020 (EP) .................................... 20172770

(51) Int. Cl.
*G01B 11/30* (2006.01)
*G01B 11/16* (2006.01)
(Continued)

(52) U.S. Cl.
CPC .............. *G01B 11/30* (2013.01); *G01B 11/16* (2013.01); *G01B 11/24* (2013.01); *G03F 7/0005* (2013.01); *G01B 2210/56* (2013.01)

(58) Field of Classification Search
CPC ......... G01B 11/30; G01B 11/16; G01B 11/24; G01B 2210/56; G03F 7/0005; G03F 9/7026; G03F 9/7092; G03F 9/7034
See application file for complete search history.

(56) References Cited

U.S. PATENT DOCUMENTS 6,952,253 B2 10/2005 Lof et al.
7,265,364 B2 9/2007 Teunissen et al.
(Continued)

FOREIGN PATENT DOCUMENTS

CN 109804316 A 5/2019
JP H09-17717 A 1/1997
(Continued)

OTHER PUBLICATIONS

International Search Report and Written Opinion of the International Searching Authority directed to related International Patent Application No. PCT/EP2021/058125, mailed Jun. 22, 2021; 11 pages.
(Continued)

*Primary Examiner* — Hung V Nguyen
(74) *Attorney, Agent, or Firm* — Sterne, Kessler, Goldstein & Fox 1P.L.L.C.

(57) ABSTRACT

Systems, apparatuses, and methods are provided for generating level data. An example method can include receiving first level data for a first region of a substrate. The first region can include a first subregion having a first surface level, and a second subregion having a second surface level. The example method can further include generating, based on the first level data, measurement control map data. The
(Continued)

example method can further include generating, based on the measurement control map data, second level data for a second region of the substrate. The second region can include a plurality of third subregions each having a third surface level equal to about the first surface level, and, optionally, no region having a surface level equal to about the second surface level.

17 Claims, 12 Drawing Sheets

(51) Int. Cl.
    *G01B 11/24*     (2006.01)
    *G03F 7/00*     (2006.01)

(56) References Cited

U.S. PATENT DOCUMENTS

| | | | |
|---|---|---|---|
| 7,511,799 | B2 | 3/2009 | Tel et al. |
| 7,646,471 | B2 | 1/2010 | Teunissen et al. |
| 8,842,293 | B2 | 9/2014 | Den Boef et al. |
| 8,948,495 | B2 | 2/2015 | Marcuccilli et al. |
| 9,488,465 | B2 * | 11/2016 | Khuat Duy ........ G01B 11/0608 |
| 9,881,400 | B2 * | 1/2018 | Zuiderweg ......... G01B 11/2441 |
| 10,241,425 | B2 * | 3/2019 | Reijnders .............. G03F 9/7046 |
| 10,274,838 | B2 * | 4/2019 | Wu ....................... G03F 9/7057 |
| 10,503,087 | B2 | 12/2019 | Queens et al. |
| 11,137,695 | B2 | 10/2021 | Donkerbroek et al. |
| 11,392,044 | B2 | 7/2022 | Huijgen et al. |
| 2002/0158185 | A1 | 10/2002 | Nelson et al. |
| 2005/0259272 | A1 | 11/2005 | Wang et al. |
| 2007/0085991 | A1 | 4/2007 | Liegl et al. |
| 2009/0325087 | A1 | 12/2009 | Lyons |
| 2013/0215404 | A1 | 8/2013 | Den Boef |
| 2016/0027194 | A1 | 1/2016 | Zuiderweg et al. |
| 2016/0370711 | A1 * | 12/2016 | Schmitt-Weaver ......................... G03F 7/70725 |

FOREIGN PATENT DOCUMENTS

| | | |
|---|---|---|
| JP | 2006-343152 A | 12/2006 |
| JP | 2016-218355 A | 12/2016 |
| JP | 2018-017608 A | 2/2018 |
| JP | 2018-528462 A | 9/2018 |
| JP | 2020-057008 A | 4/2020 |
| TW | 2019-21182 A | 6/2019 |

OTHER PUBLICATIONS

International Preliminary Report on Patentability directed to related International Patent Application No. PCT/EP2021/058125, issued Nov. 8, 2022; 8 pages.
"Measuring 3D NAND intra-die overlay by using a Level Sensor" Research Disclosure No. 649022, May 2018;3 pages.
Kim et al., "Process margin improvement through finger-print removal based on scanner leveling data," Proc. Of SPIE, vol. 10147, Optical Microlithography XXX, Apr. 11, 2017; pp. 1-12.
Simiz et al., "Product layout induced topography effects on intrafield levelling," Proc. of SPIE, vol. 9661, Sep. 2015; 7 pages.
Yahiro et al., "Standalone alignment technology enabling feed-forward compensation of on-product overlay errors," Proc. of SPIE, vol. 10959, Metrology, Inspection, and Process Control for Microlithography XXXIII, Mar. 26, 2019; pp. 1-6.

* cited by examiner

SYSTEM AND METHOD FOR GENERATING LEVEL DATA FOR A SURFACE OF A SUBSTRATE

CROSS-REFERENCE TO RELATED APPLICATIONS

This application claims priority of EP application 20172770.8 which was filed on May 4, 2020 and which is incorporated herein in its entirety by reference.

TECHNICAL FIELD

The present disclosure relates to lithography, and more particularly to systems and methods for focusing a lithographic tool.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is interchangeably referred to as a mask or a reticle, can be used to generate a circuit pattern to be formed on an individual layer of the IC being formed. This pattern can be transferred onto a target portion (e.g., including part of, one, or several dies) on a substrate (e.g., a silicon wafer). Transfer of the pattern is typically via imaging onto a layer of radiation-sensitive material (e.g., resist) provided on the substrate. In general, a single substrate will contain a network of adjacent target portions that are successively patterned. Traditional lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel (e.g., opposite) to this scanning direction. It is also possible to transfer the pattern from the patterning device to the substrate by imprinting the pattern onto the substrate.

As semiconductor manufacturing processes continue to advance, the dimensions of circuit elements have continually been reduced while the amount of functional elements, such as transistors, per device has been steadily increasing over decades, following a trend commonly referred to as Moore's law. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nanometers (nm) (i-line), 248 nm, 193 nm and 13.5 nm.

SUMMARY

The present disclosure describes various aspects of systems, apparatuses, methods, and computer program products for generating level data for a surface of a substrate (e.g., a wafer having a surface with multiple height levels) in a faster and more precise manner to accurately measure height variations over the substrate within each area of the substrate at each level of the substrate. In some aspects, the systems, apparatuses, methods, and computer program products disclosed herein can perform large range leveling for three-dimensional memory arrays (e.g., three-dimensional NOT-AND (3D NAND) memory arrays) and calibrate device topography based on the generated level data and other techniques described herein. In some aspects, the systems, apparatuses, methods, and computer program products disclosed herein can utilize a combination of a fine sensor and a coarse sensor (e.g., that can be implemented using the same sensor or different sensors), where the coarse sensor measures the height difference between the memory cell and periphery for use in determining the validity of certain regions and the fine sensor measures the height variation at one level (e.g., the memory cell).

In some aspects, the present disclosure describes a system. The system can include a level sensing controller configured to receive first level data for a first region of a substrate. The first region can include a first subregion having a first surface level and a second subregion having a second surface level. In one illustrative and non-limiting example, the first surface level can correspond to a top surface of a memory cell, and the second surface level can correspond to a bottom surface of a periphery disposed adjacent to the memory cell. The level sensing controller can be further configured to generate measurement control map data (e.g., including areas of interest, invalid areas, or both) based on the first level data. The system can further include a second level sensing device configured to generate, based on the measurement control map data (e.g., based on the areas of interest), second level data for a second region of the substrate. In some aspects, the measurement control map data can include at least one of a servo offset map (x,y) and a validity map (x,y). The second region can include a plurality of third subregions each having a third surface level equal to about the first surface level. Optionally, in some aspects, the second region can further include no region having a surface level equal to about the second surface level.

In some aspects, the level sensing controller can be further configured to receive design layout data. In some aspects, the design layout data can include a Graphic Data System (GDS) data file. In some aspects, the received design layout data can include the first level data, the level sensing controller can be further configured to extract the first level data from the received design layout data. In other aspects, the level sensing controller can be further configured to generate the first level data based on the received design layout data.

In some aspects, the system can further include a first level sensing device configured to generate the first level data and transmit, directly or indirectly, the first level data to the level sensing controller. In some aspects, the first level sensing device can be further configured to generate the first level data at a first resolution. In some aspects, the second level sensing device can be further configured to generate the second level data at a second resolution. In some aspects, the second resolution can be higher than the first resolution. For example, a second measurement noise of the second level data can be less than about 5 nanometers, and a first measurement noise of the first level data can be less than about 5 microns. In some aspects, the first level sensing device can be further configured to generate the first level data during a first duration of measurement. In some aspects, the second level sensing device can be further configured to generate the second level data at a second duration of measurement. In some aspects, the first duration of measurement can be greater than the second duration of measurement. In some aspects, the first level sensing device can include a visible spectrum sensor. In some aspects, the second level sensing device can include an ultraviolet spectrum sensor. In some aspects, the first level sensing device and the second level sensing device can be included in the same level sensing device such as a level sensor. In some aspects, the first level sensing device and the second level sensing device can be included in a single-chip level sensor (e.g., a level sensing chip). In other aspects, the first level sensing device and the second level sensing device can be included in two different level sensing devices such as an air gauge (e.g., a gas gauge proximity sensor) and an optical sensor.

In some aspects, the level sensing controller can be configured to generate the measurement control map data based on an application of a first weighting value to the first subregion and a second weighting value to the second subregion. In one illustrative and non-limiting example, the first weighting value can be about one, and the second weighting value can be about zero.

In some aspects, the level sensing controller can be further configured to generate first topographic map data based on the first level data. In some aspects, the level sensing controller can be further configured to generate second topographic map data based on the second level data. In some aspects, the second topographic map data can be different from the first topographic map data.

In some aspects, the level sensing controller can be further configured to generate a servo control signal based on the measurement control map data. In some aspects, the servo control signal can be configured to instruct the second level sensing device to use a specific servo offset. In some aspects, the servo control signal can be configured to instruct the second level sensing device to follow the substrate topography at about the third surface level. In some aspects, the servo control signal can be further configured to instruct the second level sensing device to keep the third surface level within a measurement range (or, in some aspects, at about a focal plane) of the second level sensing device during a measurement process. In some aspects, the servo control signal can be further configured to instruct the second level sensing device to modify a servo height target. For example, in some aspects, the servo control signal can be further configured to instruct the second level sensing device to modify the servo height target to be between the first surface level and the second surface level.

In some aspects, the present disclosure describes an apparatus. The apparatus can include a level sensing controller configured to receive first level data for a first region of a substrate. The first region can include a first subregion having a first surface level, and a second subregion having a second surface level. The level sensing controller can be further configured to generate measurement control map data based on the first level data. The apparatus can further include a second level sensing device configured to generate, based on the measurement control map data, second level data for a second region of the substrate. The second region can include a plurality of third subregions each having a third surface level equal to about the first surface level, and, in some optional aspects, no region having a surface level equal to about the second surface level.

In some aspects, the present disclosure describes a method for generating level data. The method can include generating, by a level sensing controller, first level data for a first region of a substrate. The first region can include a first subregion having a first surface level, and a second subregion having a second surface level. The method can further include generating, by the level sensing controller and based on the first level data, measurement control map data. The method can further include generating, by a second level sensing device and based on the measurement control map data, second level data for a second region of the substrate. The second region can include a plurality of third subregions each having a third surface level equal to about the first surface level, and, in some optional aspects, no region having a surface level equal to about the second surface level.

In some aspects, the method can further include receiving, by the level sensing controller, design layout data that includes the first level data. In some aspects, the design layout data can include a GDS data file.

In some aspects, the method can further include generating, by a first level sensing device, the first level data and transmitting, by the first level sensing device, the first level data to the level sensing controller. In some aspects, the method can further include generating, by the first level sensing device, the first level data at a first resolution and a first duration of measurement. In some aspects, the method can further include generating, by the second level sensing device, the second level data at a second resolution and a second duration of measurement. In some aspects, the second resolution can be greater than about the first resolution. In some aspects, the second duration of measurement can be less than about the second duration of measurement.

In some aspects, the method can further include generating, by the level sensing controller, the measurement control map data based on an application of a first weighting value to the first subregion and a second weighting value to the second subregion.

In some aspects, the method can further include generating, by the level sensing controller, first topographic map data based on the first level data. In some aspects, the method can further include generating, by the level sensing controller, second topographic map data based on the second level data. In some aspects, the second topographic map data is different from the first topographic map data.

In some aspects, the method can further include generating, by level sensing controller, a servo control signal based on the measurement control map data. In some aspects, the method can further include following, by the second level sensing device and based on the servo control signal, the substrate topography at about the third surface level. In some aspects, the method can further include keeping, by the second level sensing device and based on the servo control signal, the third surface level within a measurement range (or, in some aspects, at about a focal plane) of the second level sensing device during a measurement process. In some aspects, the method can further include modifying, by the second level sensing device and based on the servo control signal, a servo height target to between the first surface level and the second surface level.

Further features and advantages, as well as the structure and operation of various aspects, are described in detail below with reference to the accompanying drawings. It is noted that the disclosure is not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the aspects of this disclosure and to enable a person skilled in the relevant art(s) to make and use the aspects of this disclosure.

Figure 1:
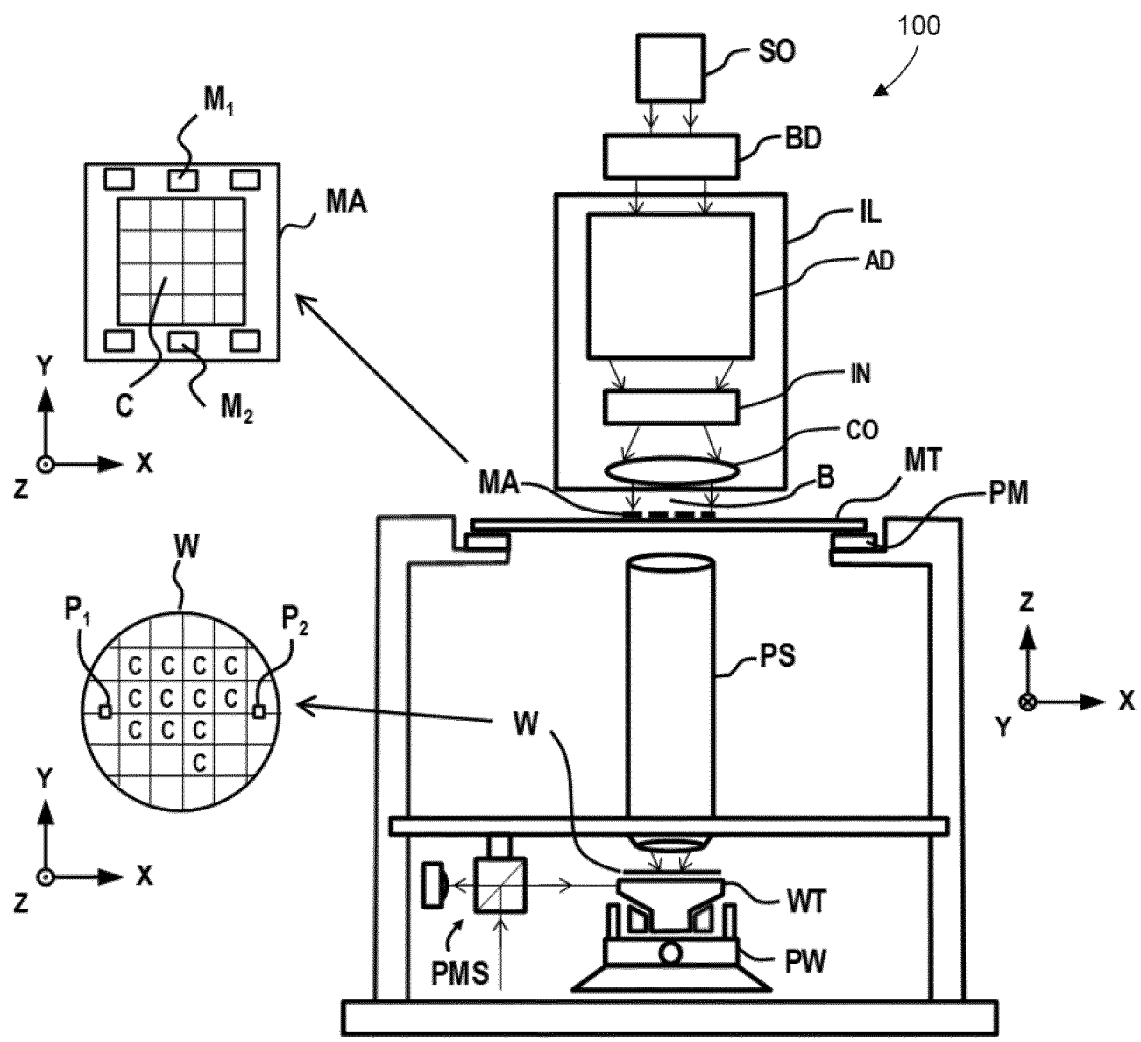
FIG. 1 is a schematic illustration of an example lithographic apparatus according to some aspects of the present disclosure.

The features and advantages of the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) merely describe the present disclosure. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Overview

In one example, a lithographic apparatus such as a scanner can include a level sensor (or height sensor) to measure the height of a wafer surface before exposure. The lithographic apparatus can use this measurement: (i) to calculate the expose profiles followed by the wafer stage during the exposure (and, in some aspects, projection system characteristics); and (ii) for diagnostics on leveling and focus errors made during exposure. The level sensor can control the wafer stage while trying to keep the wafer in focus while measuring the wafer map. The level sensor capture is the initial measurement to find the surface of the wafer.

With increasing device topography, especially in 3D NAND memory arrays, the requirements of the level sensor become more stringent, both in terms of range and resolution. On KrF systems, for example, device topographies can have steps of multiple microns, such as when fabricating staircase structures. Other 3D NAND memory arrays on ArF and ArFi systems are typically planarized, having topographies of up to 200 nm. In another example, device topographies of over 20 microns are expected in the near future, and device topographies of over 40 microns (e.g., based on a minimum of around 800 layers, where each layer is at least about 50 nm thick) are expected in the long term.

In one example, a level sensor can measure a height map by trying to follow the substrate topography during the measurement scan. The measurement can be used to generate a wafer height map. Subsequently, substrate exposure can be performed using the generated wafer height map. Often there is a direct relation between (1) reproducibility and noise, (2) resolution, and (3) measurement range. However, increased measurement range (z) usually results in higher noise, and increased (x,y) resolution also usually results in higher noise. Accordingly, an optimal level sensor for large range leveling and 3D NAND use cases can have: (i) a very large range (z); (ii) a high resolution (x,y); (iii) a low measurement noise (e.g., nm scale); and (iv) high accuracy (e.g., nm scale). Further, the noise should remain low as typically the same scanner is also used for other, more focus-critical layers. However, when improving one of the above parameters, the others can deteriorate.

During the measurement scan, the level sensor can remain stationary while the wafer table moves (e.g., via servo control signals) left and right to measure different areas and up and down to ensure that the surface height of the area being measured remains in the valid measurement range of the level sensor. Even when encountering a substantial change in surface height (e.g., when traversing over a trench), the level sensor instructs the wafer table to move up or down to follow the surface topography of each area, resulting in measurement faults (e.g., inaccurate measurements, measurement errors arising from the measurement of non-critical surfaces such as trenches).

In addition, if the range of the device topography exceeds that of the level sensor, the following failure modes may occur:
  a. Level sensor capture fails (e.g., sensor (automatic) focus control or measurement height control);
  b. Level sensor capture on wrong level (e.g., periphery instead of memory cell), resulting in unexpected offset;
  c. Problems to get correct height; and
  d. Period jumps in wafer map (e.g., wrong height measurement, large gain errors, servo issues (e.g., dynamics, cannot follow)).

In one example, these practical problems (e.g., "level sensor fails") can be more important than having a perfect height map of the device topography and its variation for leveling. In another example, some level sensors (or processor that interacts with the level sensor) apply a correction (e.g., by applying weights to different areas) after the topography of the wafer is measured and after the wafer map is formed.

In contrast, some aspects of the present disclosure can define regions of interest (e.g., critical areas or subregions requiring accurate surface topography measurements) based on coarse height data obtained by "pre-scanning" the substrate topography using a coarse height sensor or from a received GDS file. Some aspects of the present disclosure can perform the pre-scan in a separate measurement action or on the fly (e.g., using two sensors in series). Some aspects of the present disclosure can then generate a measurement control map that includes a servo offset map (x,y), a validity map (x,y), or both. In one illustrative and non-limiting example, where every field on every wafer has substantially the same device topography, some aspects of the present disclosure can generate the measurement control map based on that fact. Subsequently, some aspects of the present disclosure can measure the height map using the measurement control map to ensure that the regions or interest are measured accurately. Finally, substrate exposure can be performed using the generated height map.

In some aspects, the servo offset map (x,y) can include a set of bias settings configured to control the height (e.g., along the Z-axis) of the substrate table for different regions (e.g., along the XY-plane) during a measurement scan. In some aspects, the servo offset map can include: an "activate servo," "servo is active," or "servo control is available" value, flag, or control signal, or any other suitable characteristic, for each of the regions of interest (e.g., a plurality of "valid for measurement" subregions); and a "deactivate servo," "servo is not active," or "servo control is not available" value, flag, or control signal, or any other suitable characteristic, for each of the non-critical regions (e.g., a plurality of "not valid for measurement" subregions). During the measurement scan, in some aspects, the level sensing device (e.g., height sensing device) disclosed herein can remain stationary while the substrate table moves (e.g., via servo control signals generated by a level sensing controller based on the servo offset map) left and right to measure different regions but remains generally at a position (e.g., along the Z-axis) where the surface height of the regions of interest remain at or near the focal point of the measurement radiation emitted by the level sensing device (e.g., where the level sensing device comprises a radiation-emitting sensor) or around the middle of the range of the level sensing device (e.g., where the level sensing device comprises an air gauge). As a result, when encountering a non-critical region having a substantial change in surface height (e.g., when traversing over a trench), the level sensing device disclosed herein can instruct the substrate table not to move up or down to follow the surface topography of that non-critical region (e.g., by deactivating servo control during the measurement of that non-critical region), resulting in a reduction in measurement faults and an increase in measurement speed and accuracy for the regions of interest (e.g., by ignoring or bypassing non-critical surfaces such as trenches).

In some aspects, the validity map (x,y) can include a set of validity settings (e.g., pre-measurement validity settings) configured to enable control of the height of the substrate table only for regions of interest during a measurement scan. In some aspects, the validity map can include: a value of one (e.g., "1" or "1.00"), a "valid" metadata flag, or any other suitable characteristic for each of the regions of interest (e.g., for which a bias is less than or equal to a maximum bias value); and a value of zero (e.g., "0" or "0.00"), an "invalid" metadata flag, or any other suitable characteristic for each of the non-critical regions (e.g., for which a bias is greater than a maximum bias value). In some aspects, the level sensing device disclosed herein can: follow the surface topography of the substrate (e.g., by adjusting the position of the substrate table when the distance between the level sensing device and the substrate changes) when the validity map value is one; and not follow the surface topography of the substrate (e.g., by not adjusting the position of the substrate table when the distance between the level sensing device and the substrate changes) when the validity map value is zero. During the measurement scan, in some aspects, the level sensing device disclosed herein can: measure the height of regions of interest based on their validity map value of one; and not measure the height of non-critical regions based on their validity map value of zero. In other aspects, during the measurement scan, the level sensing device disclosed herein can: generate transmit a servo control signal to the servo configured to instruct the servo to adjust the position of the substrate table for regions of interest such that the surface height of the regions of interest remain at or near the focal point of the measurement radiation emitted by the level sensing device (e.g., indicating that the surface of the substrate needs to be in focus of the level sensing device for regions of interest); and neither generate nor transmit a servo control signal to the servo to adjust the position of the substrate table for non-critical regions (e.g., indicating that the surface of the substrate does not need to be in focus of the level sensing device for non-critical regions). In some aspects, when encountering a non-critical region having a substantial change in surface height, the level sensing device disclosed herein purposefully does not instruct the substrate table to move up or down to follow the surface topography of that non-critical region, resulting in a reduction in measurement faults and an increase in measurement speed and accuracy for the regions of interest. In some aspects, the validity map (x,y) can include a set of validity settings (e.g., post-measurement validity settings) configured to instruct the level sensing controller not to use (e.g., to discard) height measurements obtained from non-critical regions in determining the surface topography of the substrate.

In further contrast, some aspects of the present disclosure can provide substantially increased (and, in some aspects, unlimited) range as long as there is sufficient surface to measure on (e.g., while the cell area remains dominant). For example, some aspects of the present disclosure can apply a correction (e.g., by applying weights to different areas) before the wafer topography is measured to identify areas of interest and then use servo control during the measurement of the wafer topography to follow the wafer topography and to keep the wafer surface at the sensor focal plane only at those areas that are of interest. Some aspects of the present disclosure can define these areas of interest based on data acquired or generated before the actual height measurement starts. For example, some aspects of the present disclosure can acquire or obtain this data before the actual height measurement starts using the same level sensor LS, a different sensor, any other suitable device, or any combination thereof. In another example, some aspects of the present disclosure can generate this data before the actual height measurement starts based on metrology data (e.g., separate metrology tools), GDS files or design layouts (e.g., provided by a user or retrieved from a storage device), any other suitable data or electronic information, or any combination thereof.

In some aspects, the present disclosure describes a system that receives data of a region at a substrate representative for a first subregion and a second subregion at the substrate. The received data can include, for example, height information received from a first height sensing device, a GDS file, or both. In some aspects, only one of the two subregions may be of interest (e.g., critical area for lithographic processes). That is, for height measurements, only the height at, for example, the first subregion needs to be measured accurately. By selecting those "critical" areas at a substrate that correspond to the first subregion (e.g., received data), these selected areas can be measured within the device measurement range (e.g., in focus) during the next measurement step. This may be done by moving the substrate and device with respect to each other (e.g., servo control), such that the selected areas fall within the measurement range as the device is at one of the selected areas. Note, the height sensing device typically "follows" the topography of the substrate that is being measured and thus also those areas that fall outside the range at that moment.

In some aspects, areas that correspond to the second area (e.g., areas that are not of interest or not critical) may not fall within the measurement range. At these areas, the substrate and device cannot move with respect to each other (e.g., no servo control to adjust mutual distance). Thus, the distance as defined by the first area can be kept. In other aspects, both critical and non-critical areas can be kept within measurement range of the height sensing device (e.g., using a servo offset).

In some aspects, defining or selecting the regions of interest to be used for the accurate height measurements can be performed by applying weights to the different subregions. In some aspects, servo control signals that would otherwise result in position adjustments of the substrate can be ignored to ensure that the subregion is within the measurement range. In some aspects, the control map can include more than two levels or surfaces as output. Thus, the control map can include a plurality of areas with different weights. In some aspects, the "coarse map" can be measured on the fly by a first (e.g., coarse) height sensing device. That is, data from the first height sensing device can be processed and directly compared with an expected value. If the value is within a defined range, the corresponding area can be measured by the second (e.g., fine) height sensing device (e.g., under servo control). In some aspects, if outside the acceptable range (e.g., the area may not be in the measurement range), no corrective signal will be send to the servo.

In some aspects, as device topography reproduces, some aspects of the present disclosure can calibrate the device topography using a coarse measurement once per layer. The coarse calibration measurement can be achieved by the level sensor itself, or with a separate sensor having a large range. With the capture spot (or with the measurement spots) of the level sensor, such a coarse measurement can be performed by executing a measurement at multiple heights. In some aspects, the measurement may not be time critical as it only has to be executed once per layer. The major area of the die, the cell, can then be accurately measured.

In some aspects, the level sensor disclosed herein can perform a calibration sequence once per layer for an average field (e.g., as described with reference to FIG. 4). For example, the level sensor disclosed herein can be configured to:

1. Measure one or multiple fields densely with large Z range scans;
2. Calculate LS height map (large range);
3. Define capture Z level and safe position for next wafers (e.g., level with largest area);
4. Define valid locations for servo control;
5. Invalidate field locations that, for example, have insufficient gain or are outside the measurement range (e.g., linear range) of the sensor;
6. Capture on valid locations (e.g., regions of interest);
7. Servo on valid area only (e.g., use valid map from initial calibration); and
8. Use trusted data subset from the measured wafer map and an intrafield map (e.g., a calibrated device topography map for the average exposure field) to report the height profile.

In some aspects, the methods disclosed herein can be extended by also measuring the level sensor gain around the servo height. For example, the methods disclosed herein can further include measuring the gain, at different locations with the field, at different servo heights. By determining at which servo height the gain is valid, the level sensor LS can determine at which servo heights the level sensor LS generates a trustworthy signal by, for example, using gain as a measure of trust.

In one illustrative example, the methods disclosed herein can further include calculating the gain in all fieldpoints (e.g., including both the cell and the periphery) by performing scans on different heights and determining whether each calculated gain is "as expected" at each specific height. If a gain is "as expected," the method can further include determining that the specific height measurement is valid. If a gain is "not as expected" (e.g., insufficient gain), the method can further include determining that the specific height measurement is not valid. In other words, when there is insufficient gain on specific locations, these locations can be made invalid, or the servo height target can be adapted such that there is sufficient gain over the full field. As a result, the methods disclosed herein can increase the range of a periodic level sensor by, for example, overcoming the periodicity of the periodic level sensor.

In some aspects, the methods disclosed herein can be further extended by using the device fingerprint in expose setpoint calculation. In some cases, it may be beneficial also to neglect the periphery in calculating expose trajectories, or to perform a "dies in spec" alike optimization on the fingerprint if focus sensitivity is known as a function of position in the field.

In some aspects, a user may be interested in using the level sensor disclosed herein to measure the topography of a wafer. In some aspects, the area of the wafer that the user may be interested in measuring accurately can be larger than the measurement spot size of the level sensor. For example, the user can be interested in measuring the top, the bottom, or any area in between a 3D-NAND structure, and the measurement spot can be configured to fit within that area. In some aspects, other areas that cannot be measured accurately may not be of primary interest to the user, and thus the level sensor can either: (i) declare the measurements of those areas invalid and not use them; or (ii) use the measurements of those areas in combination with a calibration map (e.g., by applying a set of weights to those measurements based on the calibration map).

In some aspects, the level sensor can be configured to detect if an area of the wafer can be measured accurately. For example, the level sensor can be configured to detect if an area can be measured accurately by analyzing the gain on the measured surface and comparing that gain with an expected gain. In another example, the level sensor can be configured to detect if an area can be measured accurately by using a calibration map that is noisy along the Z-axis but has high spatial resolution in the XY-plane. To obtain or generate the calibration map, the level sensor can be configured to use the capture spot (e.g., coarse measurement spot) or the measure spots (e.g., fine measurement spots) but in a different period (e.g., so the spot size is apparently smaller). Subsequently, the level sensor can be configured to use the calibration map to invalidate particular measurement readings or replace them with calibrated (e.g., but not accurate) values. In some aspects, the calibration map itself can include areas that are invalid (e.g., areas that the level sensor cannot measure or is not permitted to measure). In some aspects, the level sensor can be configured to detect these invalid areas by analyzing again the gain of the sensor used to measure those areas.

In some aspects, the present disclosure provides for a system that includes a controller and a height sensing device. The controller can be configured to receive first data for a first region of a substrate, where the first region includes (i) a first subregion having a first surface level and (ii) a second subregion having a second surface level. The controller can be further configured to generate a measurement control map based on the first data. The controller can be further configured to control a height measurement based on the measurement control map. The height sensing device can have a measurement range. The height sensing device can be configured to perform the height measurement. The height sensing device can be further configured to generate a second data for a second region of the substrate, where the second region includes (iii) a plurality of third subregions, wherein each of the plurality of third subregions has a third surface level equal to about the first surface level arranged within the measurement range.

There are many benefits to the systems, apparatuses, methods, and computer program products disclosed herein. For example, the present disclosure provides for performing all topographic measurements in the scanner. In another example, the present disclosure provides a single level sensor design for all applications. In yet another example, the present disclosure provides for high resolution.

Before describing such aspects in more detail, however, it is instructive to present an example environment in which aspects of the present disclosure can be implemented.

Example Lithographic Systems

FIG. 1 is a schematic illustration of a lithographic apparatus 100, in which aspects of the present disclosure can be implemented. As shown in FIG. 1, the lithographic apparatus 100 is illustrated from a point of view (e.g., a side view) that is normal to the XZ plane (e.g., the X-axis points to the right, the Z-axis points upward, and the Y-axis points into the page away from the viewer), while the patterning device MA and the substrate W are presented from additional points of view (e.g., a top view) that are normal to the XY plane (e.g., the X-axis points to the right, the Y-axis points upward, and the Z-axis points out of the page toward the viewer).

In some aspects, the lithographic apparatus 100 can include one or more of the following structures: an illumination system IL (e.g., an illuminator) configured to condition a radiation beam B (e.g., a deep ultra violet (DUV) radiation beam or an extreme ultra violet (EUV) radiation beam); a support structure MT (e.g., a mask table) configured to support a patterning device MA (e.g., a mask, a reticle, or a dynamic patterning device) and connected to a first positioner PM configured to accurately position the patterning device MA; and, a substrate holder such as a substrate table WT (e.g., a wafer table) configured to hold a substrate W (e.g., a resist-coated wafer) and connected to a second positioner PW configured to accurately position the substrate W. Lithographic apparatus 100 also has a projection system PS (e.g., a refractive projection lens system) configured to project a pattern imparted to the radiation beam B by patterning device MA onto a target portion C (e.g., a portion including one or more dies) of the substrate W.

Although reference is made to refractive lithographic apparatuses, it is noted that lithographic apparatuses comprising reflective projection systems and that are arranged for reflective patterning devices are within the scope of this disclosure.

In some aspects, in operation, the illumination system IL can receive a radiation beam from a radiation source SO (e.g., via a beam delivery system BD shown in FIG. 1). The illumination system IL can include various types of optical structures, such as refractive, reflective, catadioptric, magnetic, electromagnetic, electrostatic, and other types of optical components, or any combination thereof, for directing, shaping, or controlling radiation. In some aspects, the illumination system IL can be configured to condition the radiation beam B to have a desired spatial and angular intensity distribution in its cross-section at a plane of the patterning device MA.

In some aspects, the support structure MT can hold the patterning device MA in a manner that depends on the orientation of the patterning device MA with respect to a reference frame, the design of the lithographic apparatus 100, and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

In some aspects, the patterning device MA can be transmissive (as in lithographic apparatus 100 of FIG. 1) or reflective. The patterning device MA can include various structures such as reticles, masks, programmable mirror arrays, programmable LCD panels, other suitable structures, or combinations thereof. Masks can include mask types such as binary, alternating phase shift, or attenuated phase shift, as well as various hybrid mask types. In one example, a programmable mirror array can include a matrix arrangement of small mirrors, each of which can be individually tilted so as to reflect an incoming radiation beam in different directions. The tilted mirrors can impart a pattern in the radiation beam B, which is reflected by a matrix of small mirrors.

The term "projection system" PS should be interpreted broadly and can encompass any type of projection system, including refractive, reflective, catadioptric, magnetic, anamorphic, electromagnetic, and electrostatic optical systems, or any combination thereof, as appropriate for the exposure radiation being used, and/or for other factors such as the use of an immersion liquid (e.g., on the substrate W) or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps. In addition, any use herein of the term "projection lens" can be interpreted, in some aspects, as synonymous with the more general term "projection system" PS.

In some aspects, the lithographic apparatus 100 can be of a type having two (e.g., "dual stage") or more substrate tables WT and/or two or more mask tables). In such "multiple stage" machines, the additional substrate tables WT can be used in parallel, or preparatory steps can be carried out on one or more tables while one or more other substrate tables WT are being used for exposure. In one example, steps in preparation of a subsequent exposure of the substrate W can be carried out on the substrate W located on one of the substrate tables WT while another substrate W on another of the substrate tables WT is being used for exposing a pattern on another substrate W. In some aspects, the additional table may not be a substrate table WT.

In some aspects, in addition to the substrate table WT, the lithographic apparatus 100 can include a measurement stage. The measurement stage can be arranged to hold a sensor. The sensor can be arranged to measure a property of the projection system PS, a property of the radiation beam B, or both. In some aspects, the measurement stage can hold multiple sensors. In some aspects, the measurement stage can move beneath the projection system PS when the substrate table WT is away from the projection system PS.

In some aspects, the lithographic apparatus 100 can also be of a type wherein at least a portion of the substrate can be covered by a liquid having a relatively high refractive index, e.g., water, so as to fill a space between the projection system PS and the substrate W. An immersion liquid can also be applied to other spaces in the lithographic apparatus, for example, between the patterning device MA and the projection system PS. Immersion techniques provide for increasing the numerical aperture of projection systems. The term "immersion" as used herein does not mean that a structure, such as a substrate, must be submerged in liquid, but rather only means that liquid is located between the projection system and the substrate during exposure. Various immersion techniques are described in U.S. Pat. No. 6,952, 253, issued Oct. 4, 2005, and titled "LITHOGRAPHIC APPARATUS AND DEVICE MANUFACTURING METHOD," which is incorporated by reference herein in its entirety.

Referring to FIG. 1, the illumination system IL receives a radiation beam B from a radiation source SO. The radiation source SO and the lithographic apparatus 100 can be separate physical entities, for example, when the radiation source SO is an excimer laser. In such cases, the radiation source SO is not considered to form part of the lithographic apparatus 100, and the radiation beam B passes from the radiation source SO to the illumination system IL with the aid of a beam delivery system BD (e.g., shown in FIG. 1) including, for example, suitable directing mirrors and/or a beam expander. In other cases, the radiation source SO can be an integral part of the lithographic apparatus 100, for example, when the radiation source SO is a mercury lamp. The radiation source SO and the illuminator IL, together with the beam delivery system BD, if required, can be referred to as a radiation system.

In some aspects, the illumination system IL can include an adjuster AD for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illumination system IL can include various other components, such as an integrator IN and a radiation collector CO (e.g., a condenser or collector optic). In some aspects, the illumination system IL can be used to condition the radiation beam B to have a desired uniformity and intensity distribution in its cross section.

In some aspects, patterning device MA and substrate W can be aligned using mask alignment marks M1 and M2 and substrate alignment marks P1 and P2. Although FIG. 1 illustrates the substrate alignment marks P1 and P2 as occupying dedicated target portions, the substrate alignment marks P1 and P2 may be located in spaces between target portions. Substrate alignment marks P1 and P2 are known as scribe-lane alignment marks when they are located between the target portions C. Substrate alignment marks P1 and P2 can also be arranged in the target portion C area as in-die marks. These in-die marks can also be used as metrology marks, for example, for overlay measurements.

In some aspects, for purposes of illustration and not limitation, one or more of the figures herein can utilize a Cartesian coordinate system. The Cartesian coordinate system includes three axes: an X-axis; a Y-axis; and a Z-axis. Each of the three axes is orthogonal to the other two axes (e.g., the X-axis is orthogonal to the Y-axis and the Z-axis, the Y-axis is orthogonal to the X-axis and the Z-axis, the Z-axis is orthogonal to the X-axis and the Y-axis). A rotation around the X-axis is referred to as an Rx-rotation. A rotation around the Y-axis is referred to as an Ry-rotation. A rotation around about the Z-axis is referred to as an Rz-rotation. In some aspects, the X-axis and the Y-axis define a horizontal plane, whereas the Z-axis is in a vertical direction. In some aspects, the orientation of the Cartesian coordinate system may be different, for example, such that the Z-axis has a component along the horizontal plane. In some aspects, another coordinate system, such as a cylindrical coordinate system, can be used.

Referring to FIG. 1, the radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. In some aspects, the projection system PS can have a pupil conjugate to an illumination system pupil. In some aspects, portions of radiation can emanate from the intensity distribution at the illumination system pupil and traverse a mask pattern without being affected by diffraction at the mask pattern MP and create an image of the intensity distribution at the illumination system pupil.

The projection system PS projects an image MP' of the mask pattern MP, where image MP' is formed by diffracted beams produced from the mask pattern MP by radiation from the intensity distribution, onto a resist layer coated on the substrate W. For example, the mask pattern MP can include an array of lines and spaces. A diffraction of radiation at the array and different from zeroth-order diffraction generates diverted diffracted beams with a change of direction in a direction perpendicular to the lines. Undiffracted beams (e.g., so-called zeroth-order diffracted beams) traverse the pattern without any change in propagation direction. The zeroth-order diffracted beams traverse an upper lens or upper lens group of the projection system PS, upstream of the pupil conjugate of the projection system PS, to reach the pupil conjugate. The portion of the intensity distribution in the plane of the pupil conjugate and associated with the zeroth-order diffracted beams is an image of the intensity distribution in the illumination system pupil of the illumination system IL. In some aspects, an aperture device can be disposed at, or substantially at, a plane that includes the pupil conjugate of the projection system PS.

The projection system PS is arranged to capture, by means of a lens or lens group, not only the zeroth-order diffracted beams, but also first-order or first- and higher-order diffracted beams (not shown). In some aspects, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the substrate W to create an image of the mask pattern MP at highest possible resolution and process window (e.g., usable depth of focus in combination with tolerable exposure dose deviations). In some aspects, astigmatism aberration can be reduced by providing radiation poles (not shown) in opposite quadrants of an illumination system pupil. Further, in some aspects, astigmatism aberration can be reduced by blocking the zeroth-order beams in the pupil conjugate of the projection system PS associated with radiation poles in opposite quadrants. This is described in more detail in U.S. Pat. No. 7,511,799, issued Mar. 31, 2009, and titled "LITHOGRAPHIC PROJECTION APPARATUS AND A DEVICE MANUFACTURING METHOD," which is incorporated by reference herein in its entirety.

In some aspects, with the aid of the second positioner PW and a position measurement system PMS (e.g., including a position sensor such as an interferometric device, linear encoder, or capacitive sensor), the substrate table WT can be moved accurately, e.g., so as to position different target portions C in the path of the radiation beam B at a focused and aligned position Similarly, the first positioner PM and another position sensor (e.g., an interferometric device, linear encoder, or capacitive sensor) (not shown in FIG. 1) can be used to accurately position the patterning device MA with respect to the path of the radiation beam B (e.g., after mechanical retrieval from a mask library or during a scan). Patterning device MA and substrate W can be aligned using mask alignment marks M1 and M2 and substrate alignment marks P1 and P2.

In general, movement of the support structure MT can be realized with the aid of a long-stroke positioner (coarse positioning) and a short-stroke positioner (fine positioning), which form part of the first positioner PM. Similarly, movement of the substrate table WT can be realized using a long-stroke positioner and a short-stroke positioner, which form part of the second positioner PW. In the case of a stepper (as opposed to a scanner), the support structure MT can be connected to a short-stroke actuator only or can be fixed. Patterning device MA and substrate W can be aligned using mask alignment marks M1 and M2, and substrate alignment marks P1 and P2. Although the substrate alignment marks (as illustrated) occupy dedicated target portions, they can be located in spaces between target portions (e.g., scribe-lane alignment marks) Similarly, in situations in which more than one die is provided on the patterning device MA, the mask alignment marks M1 and M2 can be located between the dies.

Support structure MT and patterning device MA can be in a vacuum chamber V, where an in-vacuum robot can be used to move patterning devices such as a mask in and out of vacuum chamber. Alternatively, when support structure MT and patterning device MA are outside of the vacuum chamber, an out-of-vacuum robot can be used for various transportation operations, similar to the in-vacuum robot. In some aspects, both the in-vacuum and out-of-vacuum robots need to be calibrated for a smooth transfer of any payload (e.g., a mask) to a fixed kinematic mount of a transfer station.

In some aspects, the lithographic apparatus 100 can be used in at least one of the following modes:

1. In step mode, the support structure MT and the substrate table WT are kept essentially stationary, while an entire pattern imparted to the radiation beam B is projected onto a target portion C at one time (e.g., a single static exposure). The substrate table WT is then shifted in the X and/or Y direction so that a different target portion C can be exposed.

2. In scan mode, the support structure MT and the substrate table WT are scanned synchronously while a pattern imparted to the radiation beam B is projected onto a target portion C (e.g., a single dynamic exposure). The velocity and direction of the substrate table WT relative to the support structure MT (e.g., mask table) can be determined by the (de-)magnification and image reversal characteristics of the projection system PS.

3. In another mode, the support structure MT is kept substantially stationary holding a programmable patterning device MA, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device MA, such as a programmable mirror array.

In some aspects, the lithographic apparatus 100 can employ combinations and/or variations of the above-described modes of use or entirely different modes of use.

Lithographic apparatus 100 can form part of a lithographic cell. Lithographic cell can also include one or more apparatuses to perform pre- and post-exposure processes on a substrate. For example, these apparatuses can include spin coaters to deposit resist layers, developers to develop exposed resist, chill plates, and bake plates. A substrate handler (e.g., a robot) picks up substrates from input/output ports, moves them between the different process apparatuses and delivers them to the loading bay of the lithographic apparatus 100. These devices, which are often collectively referred to as the track, are under the control of a track control unit, which is itself controlled by a supervisory control system, which also controls the lithographic apparatus via lithography control unit. Thus, the different apparatuses can be operated to maximize throughput and processing efficiency.

Example Level Sensor

In some aspects, a level sensor (e.g., also referred to as a topography measurement system or height sensor) can be integrated in the lithographic apparatus 100 and arranged to measure a topography of a top surface of a substrate W. A computing system (e.g., example computing system 1100 shown in FIG. 9) can generate a map of the topography of the substrate W, also referred to herein as a "height map," from these measurements. The height map can include electronic information (e.g., data, numerical values) indicating a height of the substrate W as a function of the position on the substrate W. Subsequently, the computing system can use this height map to correct or adjust the position of the substrate W during transfer of the pattern on the substrate W, in order to provide an aerial image of the patterning device MA in a properly focused position on the substrate W. It will be understood that "height" in this context refers to a dimension broadly out of the plane parallel to the top surface of the substrate W (e.g., the Z-axis). In some aspects, the level sensor can perform measurements at a fixed location (e.g., relative to its own optical system) and a relative movement between the substrate W and the optical system of the level sensor can result in height measurements at locations across the substrate W.

Figure 2:
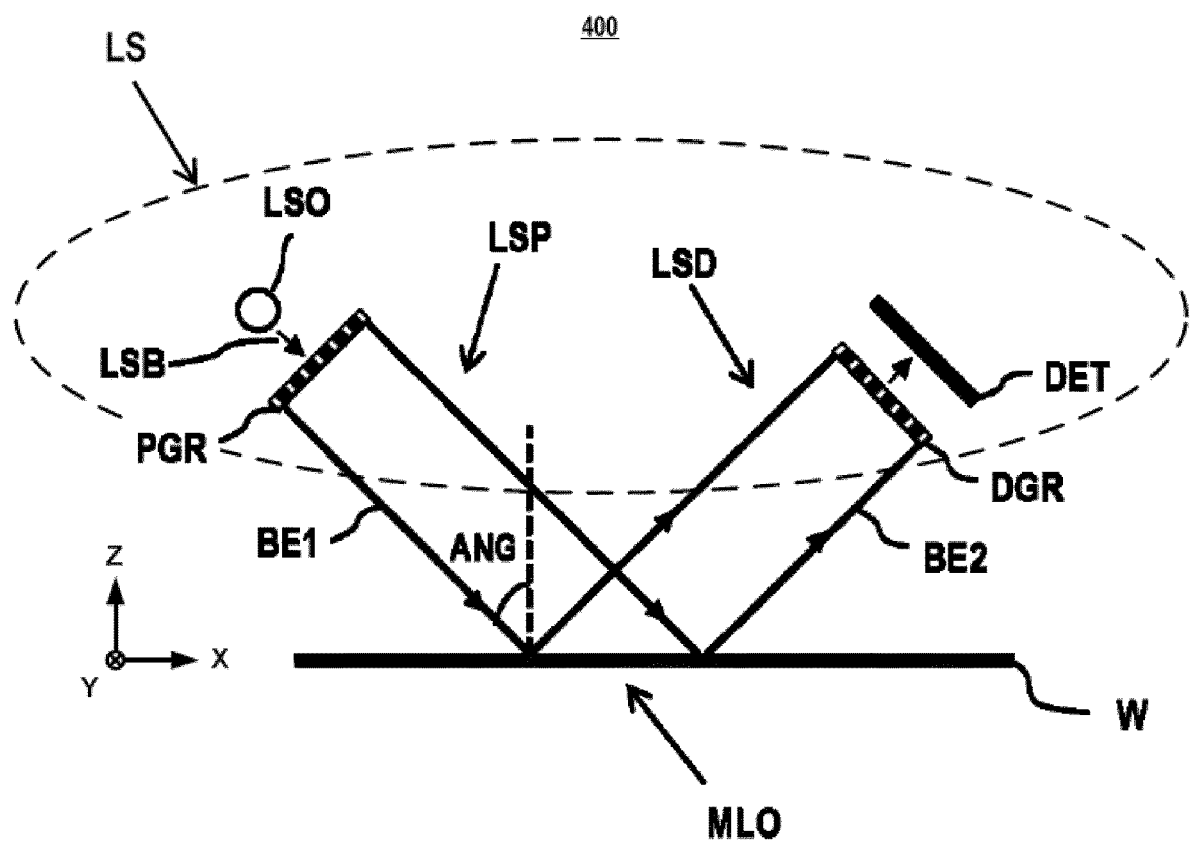
FIG. 2 is a schematic illustration of an example level sensor for an example lithographic apparatus according to some aspects of the present disclosure.

FIG. 2 shows an example environment 400 including an example level sensor LS for an example lithographic apparatus (e.g., lithographic apparatus 100 of FIG. 1) according to some aspects of the present disclosure. As shown in FIG. 2, the example level sensor LS is illustrated from a point of view (e.g., a side view) that is normal to the XZ plane. It is to be understood that FIG. 2 illustrates only the principles of operation of the example level sensor LS.

As shown in FIG. 2, the example level sensor LS includes an optical system that includes a projection unit LSP and a detection unit LSD. The projection unit LSP includes a radiation source LSO providing a radiation beam LSB, which is imparted by a projection grating PGR of the projection unit LSP. The radiation source LSO may be, for example, a narrowband or broadband radiation source, such as a supercontinuum light source, polarized or non-polarized, pulsed or continuous, such as a polarized or non-polarized laser beam. In some aspects, the radiation source LSO may include a plurality of radiation sources having different colors, or wavelength ranges, such as a plurality of LEDs. The radiation source LSO of the example level sensor LS is not restricted to visible radiation, but in some aspects may additionally or alternatively encompass UV and/or IR radiation and any range of wavelengths suitable to reflect from a surface of a substrate W or from a layer at the substrate W.

In some aspects, the projection grating PGR can be a grating including, for example, a periodic structure resulting in a patterned radiation beam BE1 having a periodically varying intensity. The patterned radiation beam BE1 can be directed towards a measurement location MLO on a substrate W having an angle of incidence ANG with respect to an axis (e.g., the Z-axis) perpendicular to the incident substrate surface between 0 degrees and 90 degrees, and in some aspects between 70 degrees and 80 degrees. At the measurement location MLO, the patterned radiation beam BE1 can be reflected by the substrate W and directed towards the detection unit LSD as indicated by reflected patterned radiation beam BE2 (e.g., a radiation beam reflected or refracted, partially or wholly, from the surface of the wafer W in response to illumination of the measurement location MLO by the patterned radiation beam BE1).

In some aspects, in order to determine the height level at the measurement location MLO, the example level sensor LS can further include a detection unit LSD including a detection grating DGR, a detector DET (e.g., a photodetector, a camera), and a computing system (e.g., example computing system 1100 shown in FIG. 9) for processing an output signal of the detector DET. In some aspects, the structure of the detection grating DGR can be identical to the structure of the projection grating PGR. In some aspects, the detector DET can generate a detector output signal indicative of the intensity of the light received or representative of a spatial distribution of the intensity received. The detector DET can include any combination of one or more detector types, such as photodetectors, imaging devices, cameras, interferometers, or other suitable devices, structures, or combinations thereof.

In some aspects, by means of triangulation techniques, the computing system can determine the height level at the measurement location MLO. The detected height level can be related to the signal strength as measured by the detector DET. In some aspects, the signal strength can have a periodicity that depends, in part, on the design of the projection grating PGR and the angle of incidence ANG (e.g., oblique).

In some aspects (not shown in FIG. 2 for the sake of brevity), the projection unit LSP and/or the detection unit LSD can include one or more optical structures, such as lenses, prisms, mirrors, beamsplitters (e.g., polarizing beamsplitters), polarizers, polarization rotators, optical crystals (e.g., non-linear optical crystals), wave plates, windows, and gratings, disposed along the path of the patterned radiation beam BE1 and the reflected patterned beam BE2 between the projection grating PGR and the detection grating DGR.

In some aspects, the detection grating DGR can be omitted, and the detector DET can be placed at the position where the detection grating DGR is located. Such a configuration can provide, in some aspects, a more direct detection of the image of the projection grating PGR. In some aspects, in order to cover the surface of the substrate W effectively, the example level sensor LS can be configured to project an array of measurement beams BE1 onto the surface of the substrate W, thereby generating an array of measurement areas MLO or spots covering a larger measurement range.

Various example height sensors are disclosed in, for example, U.S. Pat. No. 7,265,364, issued Sep. 4, 2007, and titled "LEVEL SENSOR FOR LITHOGRAPHIC APPARATUS," and U.S. Pat. No. 7,646,471, issued Jan. 12, 2010, and titled "LITHOGRAPHIC APPARATUS, LEVEL SENSOR, METHOD OF INSPECTION, DEVICE MANUFACTURING METHOD, AND DEVICE MANUFACTURED THEREBY," each of which is incorporated by reference herein in its entirety. An example height sensor using UV radiation instead of visible or infrared radiation is disclosed in, for example, U.S. Pat. No. 8,842,293, issued Sep. 23, 2014, and titled "LEVEL SENSOR ARRANGEMENT FOR LITHOGRAPHIC APPARATUS AND DEVICE MANUFACTURING METHOD," which is incorporated by reference herein in its entirety. An example compact height sensor which uses a multi-element detector to detect and recognize the position of a grating image without needing a detection grating is disclosed in, for example, U.S. Pat. No. 10,241,425, issued Mar. 26, 2019, and titled "LEVEL SEN- SOR, LITHOGRAPHIC APPARATUS AND DEVICE MANUFACTURING METHOD," which is incorporated by reference herein in its entirety.

Figure 3:
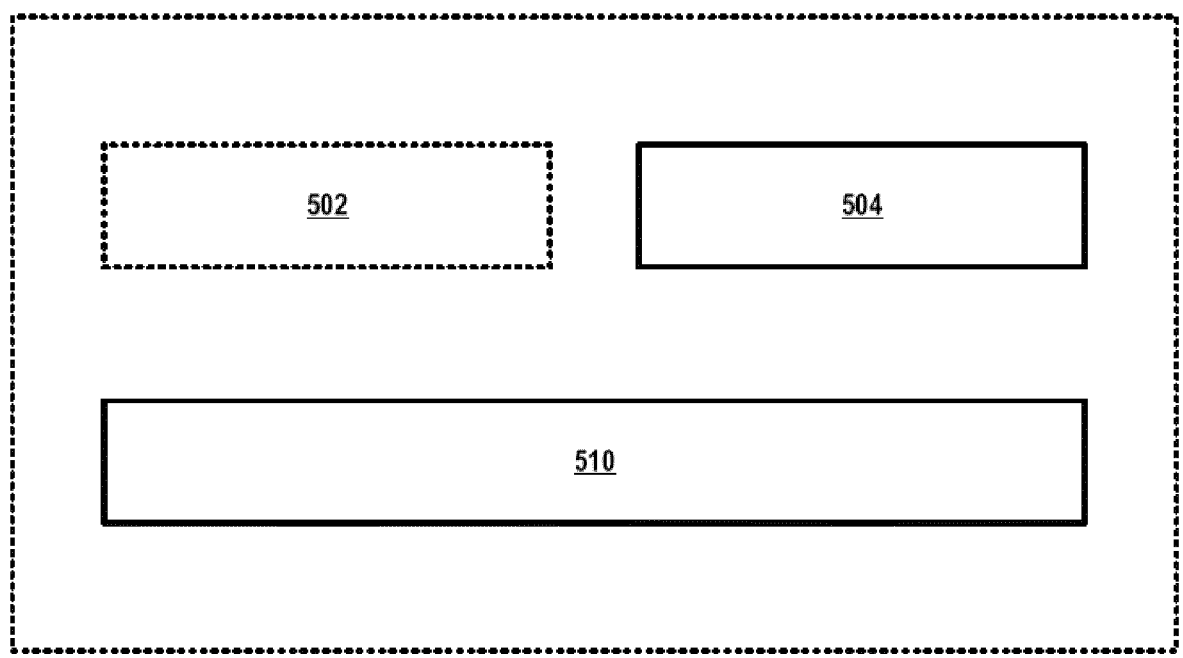
FIG. 3 is a schematic illustration of another example level sensor according to some aspects of the present disclosure.

FIG. 3 is a schematic illustration of an example level sensor 500 according to some aspects of the present disclosure. In some aspects, as shown in FIG. 3, the example level sensor 500 can include, among other structures, an optional first level sensing device 502, a second level sensing device 504, and a level sensing controller 510. Additionally or alternatively, in some aspects, the example level sensor 500 can include any of the structures, techniques, methods, data, or features described with reference to FIG. 2 above and FIGS. 4-9 below, or any combination thereof.

In some aspects, the optional first level sensing device 502 can include, but is not limited to, one or more first illumination sources, one or more first illumination sensors, any other suitable structure, or any combination thereof. In some aspects, the one or more first illumination sources can include one or more visible spectrum sources, and each of the one or more first illumination sensors can include a visible spectrum sensor. In some aspects, the optional first level sensing device 502 can be configured to generate first level data for a first region of a substrate as described herein. In some aspects, the optional first level sensing device 502 can be further configured to generate the first level data at a first resolution (e.g., a course resolution) and a first duration of measurement.

In some aspects, the second level sensing device 504 can include, but is not limited to, one or more second illumination sources and one or more second illumination sensors. In some aspects, the one or more second illumination sources can include one or more ultraviolet spectrum sources, and each of the one or more second illumination sensors can include an ultraviolet spectrum sensor. In some aspects, the second level sensing device 504 can be configured to generate, based on the measurement control map data, second level data for a second region of the substrate as described herein. In some aspects, the second level sensing device 504 can be further configured to generate the second level data at a second resolution (e.g., a fine resolution) and a second duration of measurement. In some aspects, the first resolution can be coarser than the second resolution. In some aspects, the second duration of measurement can be less than the first duration of measurement. In some aspects, a measurement noise of the second level data can be less than a measurement noise of the first level data. For example, a first measurement noise of the first level data can be less than about 5 microns, while a second measurement noise of the second level data can be less than about 5 nanometers.

In some aspects, the level sensing controller 510 can include, but is not limited to, one or more computing systems, processors, memories, any other suitable structures, and combinations thereof. In some aspects, the level sensing controller 510 can be configured to generate measurement control map data based on the first level data as described herein. In some aspects, the level sensing controller 510 can further include, or be in communication with, communications circuitry configured to receive design layout data that includes a design layout of a substrate. In some aspects, the design layout data can include the first level data. In other aspects, the level sensing controller 510 can be configured to generate the first level data based on the design layout data. In some aspects, the design layout data can include a GDS data file. In such aspects, the optional first level sensing device 502 is not required (and in some aspects may be omitted from the example level sensor 500), as the receipt of the design layout data makes it possible to generate the second level data using only the second level sensing device 504.

Figure 9:
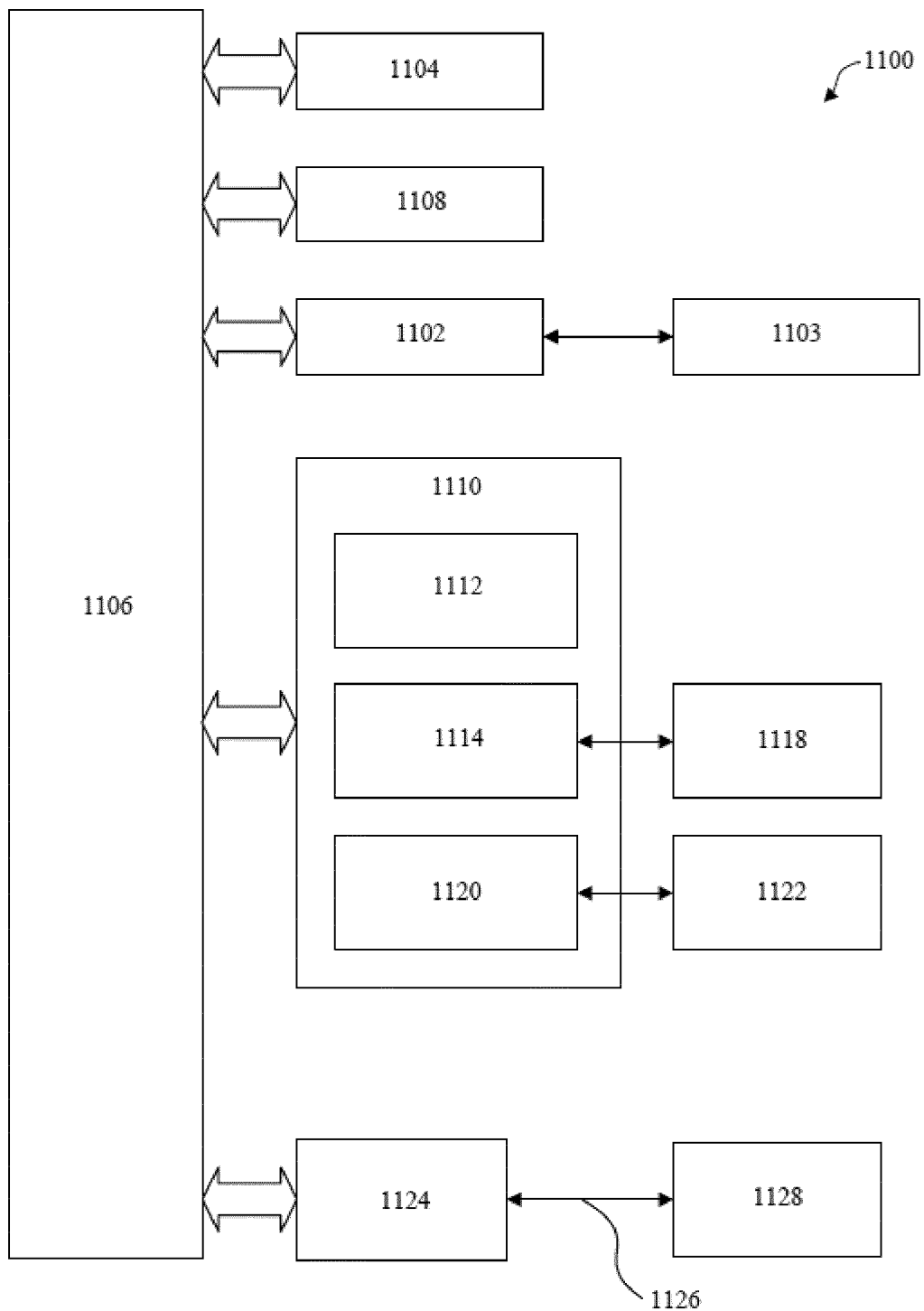
FIG. 9 is an example computer system for implementing some aspects of the present disclosure or portion(s) thereof.

As a foundation for some aspects described herein, the present disclosure describes systems, apparatuses, methods, and computer program products for providing a level sensing device, such as the example level sensor LS shown in FIG. 2; the example level sensor 500 shown in FIG. 3; the example system 900 shown in FIGS. 7A, 7B, 7C, and 7D; the example computing system 1100 shown in FIG. 9; or a combination thereof. In some aspects, the level sensing device can include a second level sensing device, a level sensing controller, and in some aspects an optional first level sensing device. In some aspects, the optional first level sensing device 502 and the second level sensing device 504 can be included in the same level sensing device (e.g., the example level sensor LS shown in FIG. 2; the example level sensor 500 shown in FIG. 3; the example system 900 shown in FIGS. 7A, 7B, 7C, and 7D; a single-chip level sensor; or any other suitable device or structure). In other aspects, the optional first level sensing device 502 and the second level sensing device 504 can be included in two different level sensing devices such as an air gauge (e.g., a gas gauge proximity sensor) and an optical sensor. In some aspects, the optional first level sensing device 502 can include a visible spectrum sensor. In some aspects, the second level sensing device 504 can include an ultraviolet spectrum sensor.

In some aspects, at the moment there is an illumination (e.g., by the optional first level sensing device 502 or the second level sensing device 504), example level sensor 500 can utilize a grating plate that includes projection gratings that are projected onto detection gratings via a substrate. In some aspects, the grating plate can include two sets of spots: (i) capture spots for coarse measurement; and (ii) measure spots for fine measurement.

In some aspects, the optional first level sensing device 502 may be arranged in a metrology apparatus, whereas the second level sensor is arranged in an exposure apparatus, e.g., a lithographic apparatus 100. The metrology apparatus may be a stand-alone apparatus or may be part of a lithographic cell.

Figure 4:
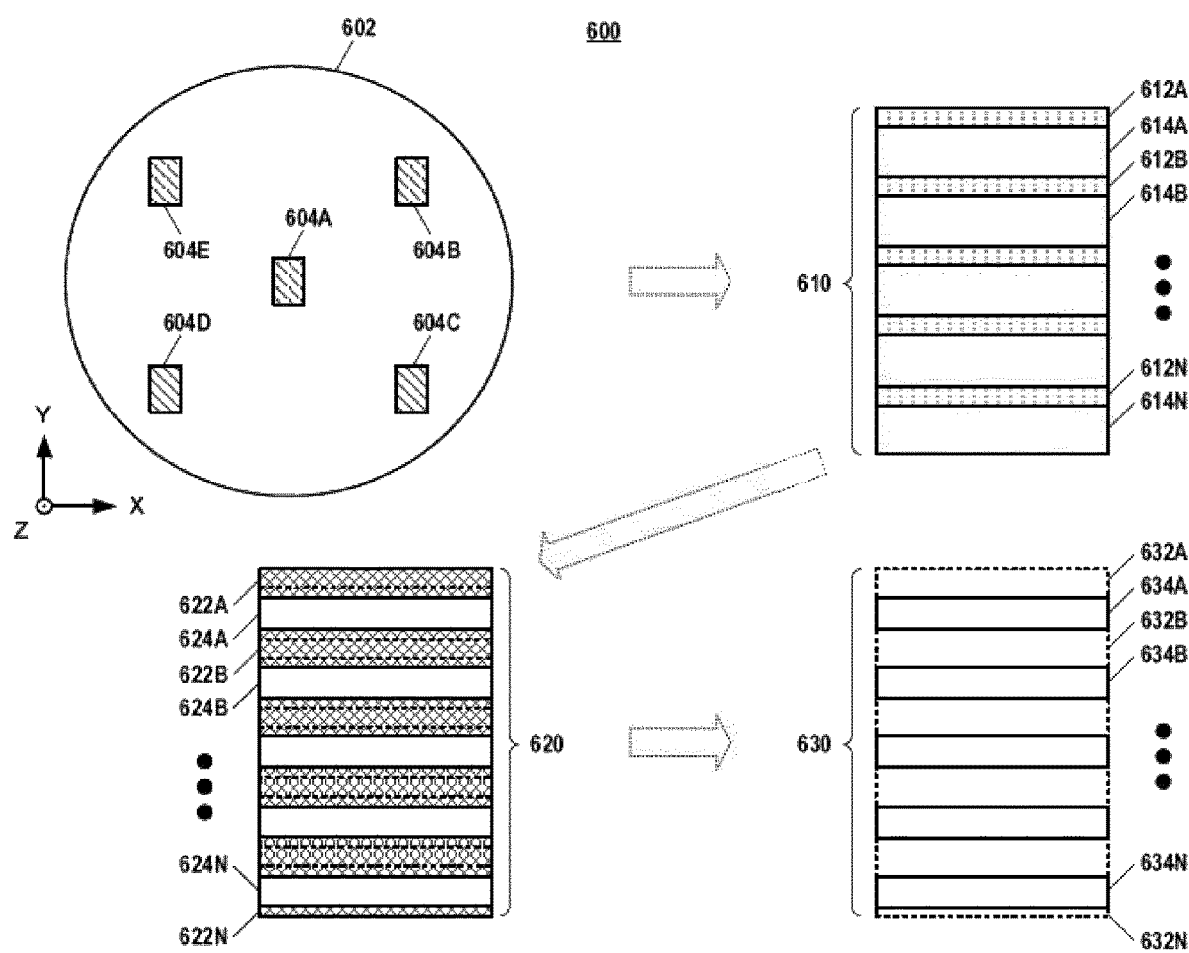
FIG. 4 is a schematic illustration of an example data environment 600 according to some aspects of the present disclosure.

FIG. 4 is a schematic illustration of an example data environment 600 according to some aspects of the present disclosure. In some aspects, the example data environment 600 shown in FIG. 4 provides a schematic representation of the device topography calibration to be performed by a level sensor (e.g., the example level sensor LS shown in FIG. 2; the example level sensor 500 shown in FIG. 3; the example system 900 shown in FIGS. 7A, 7B, 7C, and 7D) once per layer.

Figure 5A:
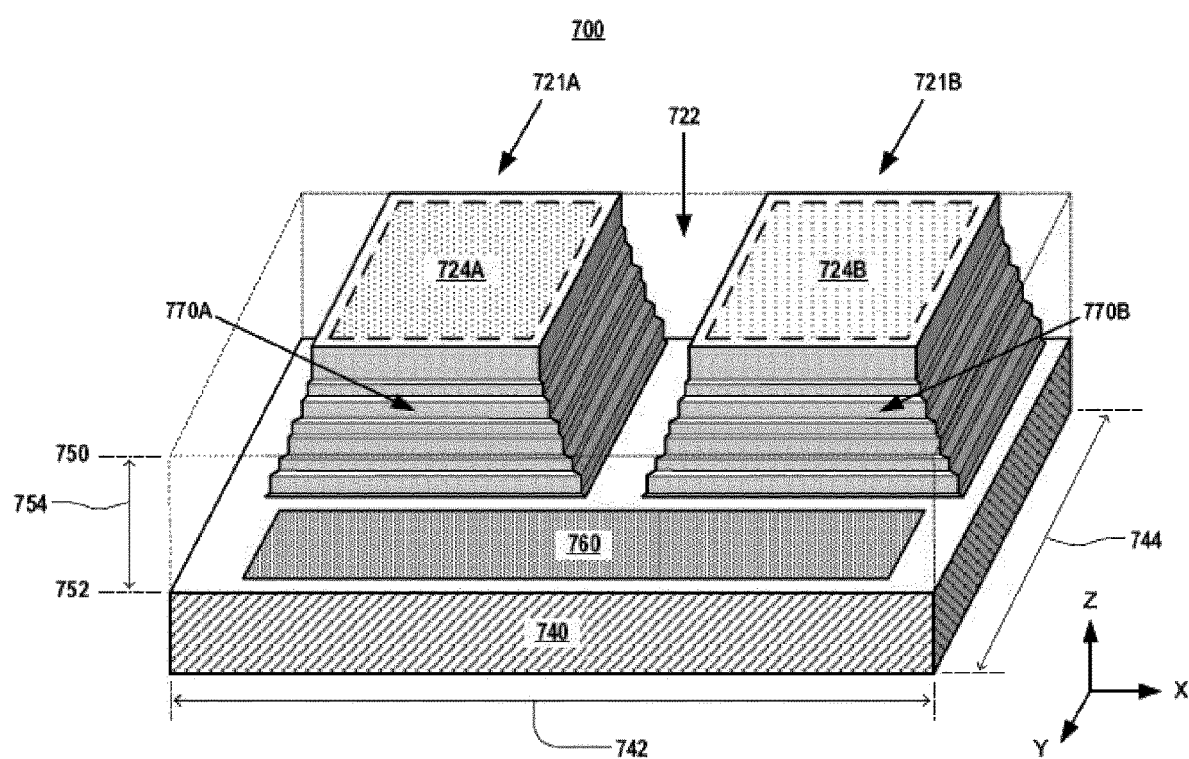
FIGS. 5A, 5B, and 5C are schematic illustrations of example arrays of memory cells according to some aspects of the present disclosure.

As shown in FIG. 4, in some aspects, the first level sensing device can be configured to generate first level data 610 for a first region of a substrate 602 (e.g., substrate W shown in FIGS. 1 and 2; substrate 5 shown in FIGS. 7A, 7B, 7C, and 7D; substrate 740 shown in FIG. 5A). In some aspects, the first level sensing device can be configured to generate the first level data 610 based on an average of a plurality of first regions 604 disposed at different locations on the surface of the substrate 602, such as the first regions 604A, 604B, 604C, 604D, and 604E.

In some aspects, the first region of the substrate 602 (e.g., one of the plurality of first regions 604, or an average of two or more of the plurality of first regions 604) can include a first subregion having a first surface level and a second subregion having a second surface level. For example, as shown in FIG. 4, the first level data 610 for the first region can include a first subregion 614A having a first surface level and a second subregion 612A having a second surface level. In some aspects, a width of the second subregion 612A can be about 5 percent to 50 percent of a width of the first subregion 614A.

In some aspects, the first level data 610 for the first region can further include a plurality of first subregions 614A, 614B, through 614N each having a surface level of about the first surface level. In some aspects, the first level data 610 for the first region can further include a plurality of second subregions 612A, 612B, through 612N each having a surface level of about the second surface level.

In some aspects, the second surface level may be lower than the first surface level. For example, a first distance between a surface of the first level sensing device and the first surface may be less than a second distance between the surface of the first level sensing device and the second surface. In one example, a difference between the first surface level and the second surface level can be greater than about 15 microns. In another example, a difference between the first surface level and the second surface level can be greater than about 50 microns.

In one illustrative and non-limiting example, the first surface level can correspond to a top surface of a memory cell, and the second surface level can correspond to a bottom surface of a periphery disposed adjacent to the memory cell. For example, each of the plurality of first subregions 614A, 614B, through 614N can correspond to a top surface of a memory cell, and each of the plurality of second subregions 612A, 612B, through 612N can correspond to a bottom surface (e.g., a trench) of a periphery disposed adjacent to the memory cell.

In some aspects, the level sensing controller can be configured to generate measurement control map data 620 based on the first level data 610. For example, as shown in FIG. 4, the measurement control map data 620 can include a "valid for measurement" subregion 624A and a "not valid for measurement" subregion 622A. In some aspects, a width of the "valid for measurement" subregion 624A can be less (e.g., slightly narrower) than the width of the first subregion 614A, and a width of the "not valid for measurement" subregion 622A can be greater (e.g., slightly wider) than the width of the second subregion 612A. For example, a width of the "not valid for measurement" subregion 622A can be about 20 percent of a width of the "valid for measurement" subregion 624A.

In some aspects, the measurement control map data 620 can further include a plurality of "valid for measurement" subregions 624A, 624B, through 624N each having a surface level of about the first surface level. In some aspects, the measurement control map data 620 can further include a plurality of "not valid for measurement" subregions 622A, 622B, through 622N each having a surface level of about the second surface level. For purposes of illustration and not limitation, the boundaries between the plurality of first subregions 614A, 614B, through 614N and the plurality of second subregions 612A, 612B, through 612N are overlaid on the measurement control map data 620 as dotted lines.

In some aspects, the level sensing controller can be configured to generate the plurality of "valid for measurement" subregions 624A, 624B, through 624N based on an application of a first weighting value (e.g., "1") to each of the plurality of first subregions 614A, 614B, through 614N. In some aspects, the level sensing controller can be configured to generate the plurality of "not valid for measurement" subregions 622A, 622B, through 622N based on an application of a second weighting value (e.g., "0") to each of the plurality of second subregions 612A, 612B, through 612N and, in some aspects, a buffer region around those subregions.

In some aspects, the level sensing controller can be configured to generate the plurality of "valid for measurement" subregions 624A, 624B, through 624N based on an application of a first metadata flag (e.g., "valid") to each of the plurality of first subregions 614A, 614B, through 614N. In some aspects, the level sensing controller can be configured to generate the plurality of "not valid for measurement" subregions 622A, 622B, through 622N based on an application of a second metadata flag (e.g., "invalid") to each of the plurality of second subregions 612A, 612B, through 612N and, in some aspects, a buffer region around those subregions.

In some aspects, the measurement control map data 620 can be indicative of an electronic instruction to generate the second level data 630 based on the plurality of first subregions 614A, 614B, through 614N and none of the plurality of second subregions 612A, 612B, through 612N. In some aspects, the level sensing controller can be further configured to generate a servo control signal based on the measurement control map data 620. In some aspects, the servo control signal can be configured to instruct the second level sensing device to neglect the plurality of "not valid for measurement" subregions 622A, 622B, through 622N in the servo control, and to set the capture locations in the servo control as the plurality of "valid for measurement" subregions 624A, 624B, through 624N. In some aspects, the measurement control map data 620 can include at least one of a servo offset map (x,y) and a validity map (x,y).

In some aspects, for each of the plurality of "valid for measurement" subregions 624A, 624B, through 624N, the measurement control map data 620 can include: an "activate servo" value, flag, or control signal (e.g., included in a servo offset map); a value of one (e.g., included in a validity map); a "valid" metadata flag; or any other suitable characteristic. In some aspects, for each of the plurality of "not valid for measurement" subregions 622A, 622B, through 622N, the measurement control map data 620 can include: a "deactivate servo" value, flag, or control signal (e.g., included in a servo offset map); a value of zero (e.g., included in a validity map); an "invalid" metadata flag; or any other suitable characteristic.

In some aspects, the servo control signal can be configured to instruct the second level sensing device to use a specific servo offset. For example, the level sensing controller can be further configured to use the first level data 610 (e.g., the coarse sensor measurement) to instruct the second level sensing device (e.g., the fine sensor) to use a specific servo offset. In some aspects, the servo control signal can be configured to instruct the second level sensing device to follow the topography of the substrate 602 at about the third surface level. In some aspects, the servo control signal can be further configured to instruct the second level sensing device to keep the third surface level within a measurement range (or, in some aspects, at about a focal plane) of the second level sensing device during a measurement process. In some aspects, the servo control signal can be further configured to instruct the second level sensing device to modify a servo height target. For example, in some aspects, the servo control signal can be further configured to instruct the second level sensing device to modify the servo height target to be between the first surface level and the second surface level (e.g., as shown in FIG. 6B).

In some aspects, the second level sensing device can be configured to generate, based on the measurement control map data 620, second level data 630 for a second region of the substrate 602. For example, as shown in FIG. 4, the second level data 630 can include a third subregion 634A having a third surface level equal to about the first surface level, but not a fourth subregion 632A having a fourth surface level equal to the second surface level.

In some aspects, the second region can include a plurality of third subregions 634A, 634B, through 634N each having a third surface level equal to about the first surface level. In some aspects, the plurality of third subregions 634A, 634B, through 634N can correspond to the plurality of "valid for measurement" subregions 624A, 624B, through 624N.

In some aspects, the second region can further include no region having a surface level equal to about the second surface level. For example, the second region can further include none of the plurality of fourth subregions 632A, 632B, through 632N. In one illustrative example, the second region can include none of the plurality of fourth subregions 632A, 632B, through 632N corresponding to the plurality of "not valid for measurement" subregions 622A, 622B, through 622N. In another illustrative example, the second region can include the plurality of fourth subregions 632A, 632B, through 632N, where each of the plurality of fourth subregions 632A, 632B, through 632N can include or be associated with a value of zero, an "invalid" metadata flag, or any other suitable characteristic configured to instruct the level sensing controller not to use that height measurement in the determination of the map of the topography of the substrate 602 (e.g., the height map).

In some aspects, the level sensing controller can further include, or be in communication with, communications circuitry configured to receive design layout data that includes a design layout of the substrate 602. In some aspects, the design layout data can include a GDS data file. In some aspects, the design layout data can include the first level data 610. In other aspects, the level sensing controller can be configured to generate the first level data 610 based on the design layout data. In some aspects, the level sensing controller can be configured to generate the measurement control map data 620 based on the received design layout data, the generated first level data 610, or both. In such aspects, the receipt of the design layout data makes it possible to generate the second level data 630 using only the second level sensing device.

In some aspects, the level sensing controller can be further configured to generate a map of the topography of the substrate 602, also referred to herein as a "height map," based on the second level data 630. In some aspects, the level sensing controller can be further configured to generate first topographic map data based on the first level data 610. In some aspects, the level sensing controller can be further configured to generate second topographic map data based on the second level data 630. In some aspects, the second topographic map data can be different from the first topographic map data.

In some aspects, the plurality of first subregions 614A, 614B, through 614N can include a plurality of memory cells, and the first surface level can correspond to the top surfaces of the plurality of memory cells. In some aspects, the plurality of memory cells can include a plurality of 3D NAND memory cells. In some aspects, the plurality of second subregions 612A, 612B, through 612N can include a plurality of peripheries disposed between respective pairs of the plurality of memory cells, and the second surface level can correspond to the bottom surfaces of the peripheries. In some aspects, the plurality of third subregions 634A, 634B, through 634N can include the plurality of memory cells, or portions thereof, where the third surface level of each of the plurality of memory cells corresponds to the top surface of each of the plurality of memory cells. In some aspects, the measurement control map data 620 can be indicative of an electronic instruction to generate the second level data 630 based on the plurality of memory cells and no periphery between any two of the plurality of memory cells. In some aspects, the second region includes no region corresponding to a periphery between any pair of the plurality of memory cells. In some aspects, the second level sensing device can be configured to generate the second level data 630 without measuring a bottom surface of a periphery between two of the plurality of memory cells (e.g., without measuring any of the plurality of fourth subregions 632A, 632B, through 632N). In some aspects, the second level sensing device can be configured to generate the second level data 630 without measuring a bottom surface of a periphery between two of the plurality of memory cells after discarding all measurements corresponding to a bottom surface of a periphery between two of the plurality of memory cells. (e.g., by measuring and then discarding, zeroing-out, or invalidating the plurality of fourth subregions 632A, 632B, through 632N).

FIG. 5A is a schematic illustration of an example architecture 700 for an example array of memory cells according to some aspects of the present disclosure. As shown in FIG. 5A, the example architecture 700 can include a substrate 740. In some aspects, the substrate 740 can have a width 742 and a length 744. In some aspects, the example architecture 700 can further include a CMOS structure 760 disposed adjacent to a first memory cell 721A (e.g., having a first staircase structure 770A), a second memory cell 721B (e.g., having a second staircase structure 770B), and a periphery 722 between the first memory cell 721A and the second memory cell 721B. In some aspects, each of the first staircase structure 770A and the second staircase structure 770B can have multiple layers.

In some aspects, a first surface level 750 can correspond to a top surface of the first memory cell 721A, a top surface of the second memory cell 721B, or both (e.g., an average value, a design value). In some aspects, a second surface level 752 can correspond to a bottom surface of the periphery 722. In some aspects, a difference between the first surface level 750 and the second surface level 752 can be greater than about 15 microns. For example, the height 754 of the first memory cell 721A, a top surface of the second memory cell 721B, or both can be about 16 microns. In some aspects, a difference between the first surface level 750 and the second surface level 752 can be greater than about 50 microns.

In some aspects, the first level sensing device can be configured to generate first level data based on the top surface of the first memory cell 721A, the top surface of the second memory cell 721B, and the bottom surface of the periphery 722.

In some aspects, the level sensing controller can be configured to generate measurement control map data based on the first level data. For example, the measurement control map data can include a first "valid for measurement" subregion 724A, a second "valid for measurement" subregion 724B, and a "not valid for measurement" subregion that includes all regions of the example array shown in FIG. 5A outside of the first "valid for measurement" subregion 724A and the second "valid for measurement" subregion 724B. In some aspects, an area of the "valid for measurement" subregion 724A can be less than the area of the top surface of the first memory cell 721A, and the area of the "valid for measurement" subregion 724B can be less than the area of the top surface of the second memory cell 721B. For example, the area of the first "valid for measurement" subregion 724A can be about 10 percent less than the area of the top surface of the first memory cell 721A. Similarly, the area of the second "valid for measurement" subregion 724B can be about 10 percent less than the area of the top surface of the second memory cell 721B.

In some aspects, the second level sensing device can be configured to generate, based on the measurement control map data, second level data that includes the first "valid for measurement" subregion 724A, the second "valid for measurement" subregion 724B, but no region outside of the first "valid for measurement" subregion 724A and the second "valid for measurement" subregion 724B. As a result, the second level data can correspond to a plurality of third subregions each having a third surface level equal to about the first surface level 750 and no region having a surface level equal to about the second surface level 752. In some aspects, the second level sensing device is configured to generate the second level data without measuring a bottom surface of the periphery 722. In some aspects, the second level sensing device is configured to generate the second level data after discarding all measurements corresponding to the periphery 722 (e.g., after discarding all measurements that do not correspond to the first "valid for measurement" subregion 724A or the second "valid for measurement" subregion 724B).

In some aspects, the level sensing controller can be further configured to generate a map of the topography of the example architecture 700, also referred to herein as a "height map," based on the second level data. In some aspects, the level sensing controller can be further configured to generate first topographic map data based on the first level data. In some aspects, the level sensing controller can be further configured to generate second topographic map data based on the second level data. In some aspects, the second topographic map data can be different from the first topographic map data. For example, the first topographic map data can include first height data (e.g., at a courser resolution) obtained from surfaces at the first surface level 750 and surfaces at the second surface level 752, while the second topographic map data can include second height data (e.g., at a finer resolution) obtained from surfaces at the first surface level 750 but not surfaces at the second surface level 752.

Figure 5B:
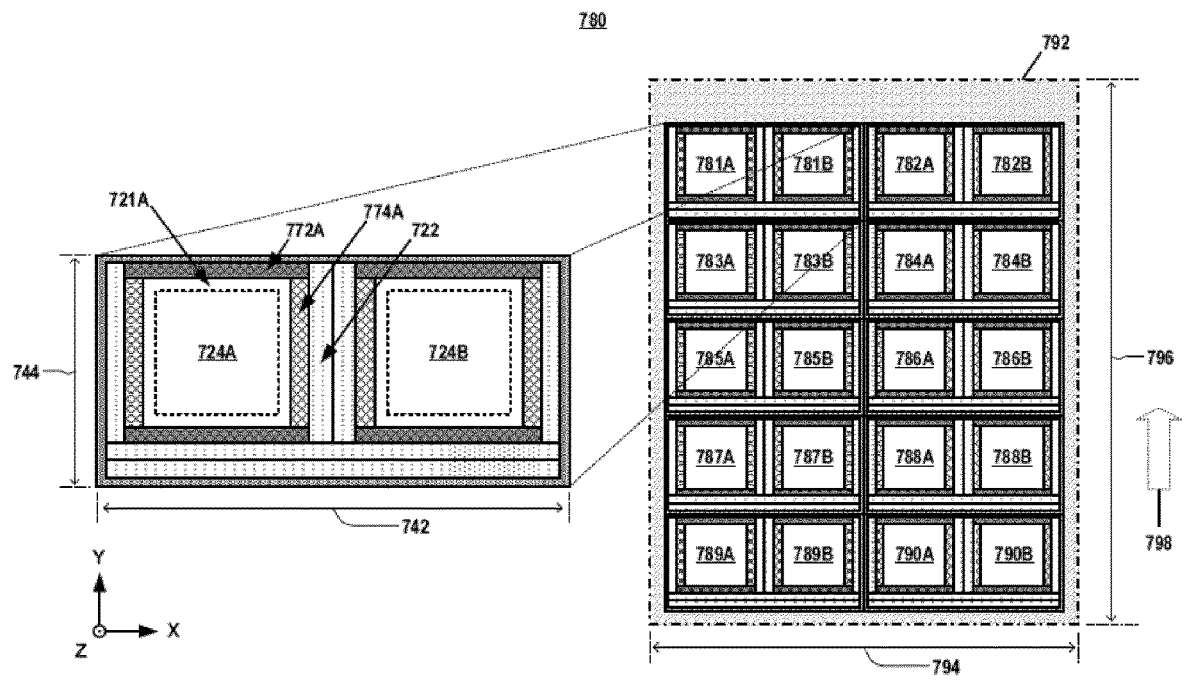

FIG. 5B is a schematic illustration of an example layout 780 for an example array of memory cells according to some aspects of the present disclosure. In some aspects, the example layout for the memory cells 781A and 781B can include the structures described with reference to FIG. 5A, such as the CMOS structure 760, the first memory cell 721A, the second memory cell 721B, and the periphery 722 between the first memory cell 721A and the second memory cell 721B. For example, the memory cell 781A can include the first memory cell 721A, a "dummy" staircase structure 772A, an "active" staircase structure 774A, a "valid for measurement" subregion 724A, and a periphery 722, among other features and structures.

As shown in FIG. 5B, the example layout 780 can further include a maximum exposure field 792 that includes a plurality of memory cell arrays, including the memory cells 781A, 781B, 782A, 782B, 783A, 783B, 784A, 784B, 785A, 785B, 786A, 786B, 787A, 787B, 788A, 788B, 789A, 789B, 790A, and 790B. In some aspects, the maximum exposure field 792 can have a width 794 and a length 796. In some aspects, a scan direction of the first level sensing device, the second level sensing device, or both is indicated by arrow 798.

Figure 5C:
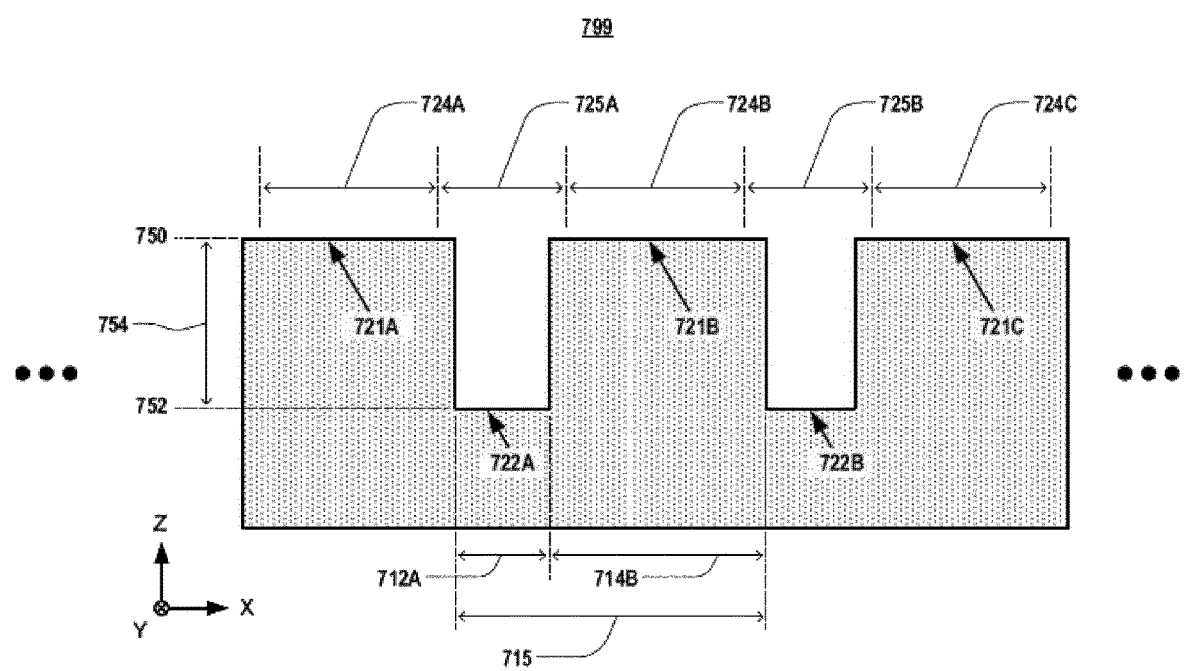

FIG. 5C is a schematic illustration of an example side view 799 of an example array of memory cells according to some aspects of the present disclosure. The example side view 799 shows a plurality of memory cells 721A, 721B, 721C, and so forth. The example side view 799 further shows a plurality of peripheries 722A, 722B, and so forth, respectively disposed between respective pairs of the plurality of memory cells 721A, 721B, 721C, and so forth (e.g., periphery 722A is disposed between the memory cells 721A and 721B, and so forth).

The example side view 799 further shows a plurality of "valid for measurement" subregions 724A, 724B, 724C, and so forth, each having a surface level of about the first surface level 750. The example side view 799 further shows a plurality of "not valid for measurement" subregions 725A, 725B, and so forth, each having a surface level of about the second surface level 752. In some aspects, the height 754 (e.g., the difference between the first surface level 750 and the second surface level 752) of plurality of memory cells 721A, 721B, 721C, and so forth can be greater than about 15 microns, 50 microns, or any other suitable height value.

In some aspects, the width of the "not valid for measurement" subregion 725A can be greater than the width 712A of the periphery 722A, and the width of the "valid for measurement" subregion 724B can be less than the width 714B of the second memory cell 721B. In one illustrative example, the width 712A can be about 10 percent of the combined width 715 of the periphery 722A and the second memory cell 721B, and the width 714B can be about 90 percent of the combined width 715. Continuing this illustrative example, the width of the "not valid for measurement" subregion 725A can be about 12 percent of the combined width 715, and the width of the "valid for measurement" subregion 724B can be about 88 percent of the combined width 715.

Figure 6A:
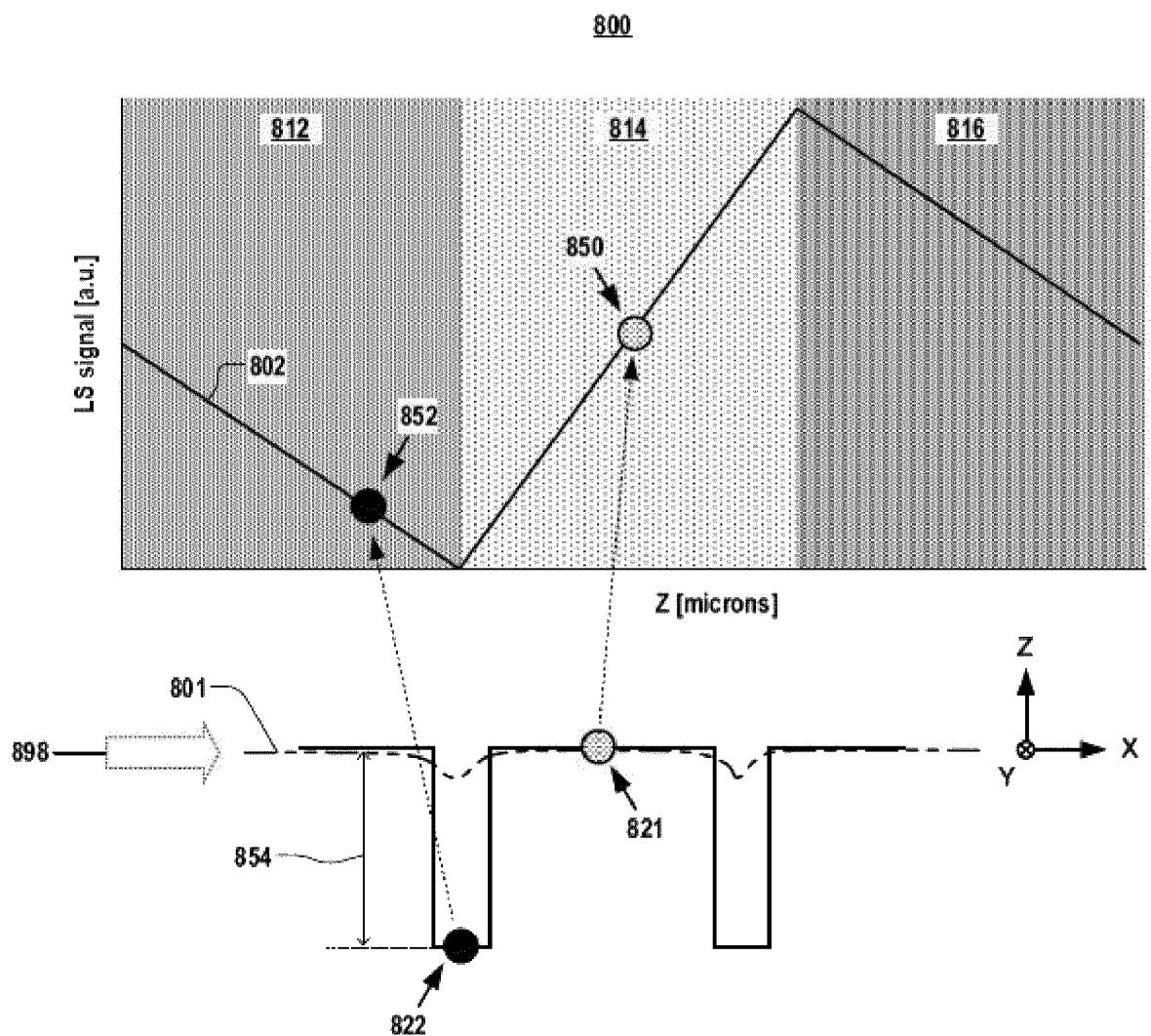
FIGS. 6A and 6B are illustrations of example height measurement data according to some aspects of the present disclosure.
Figure 6B:
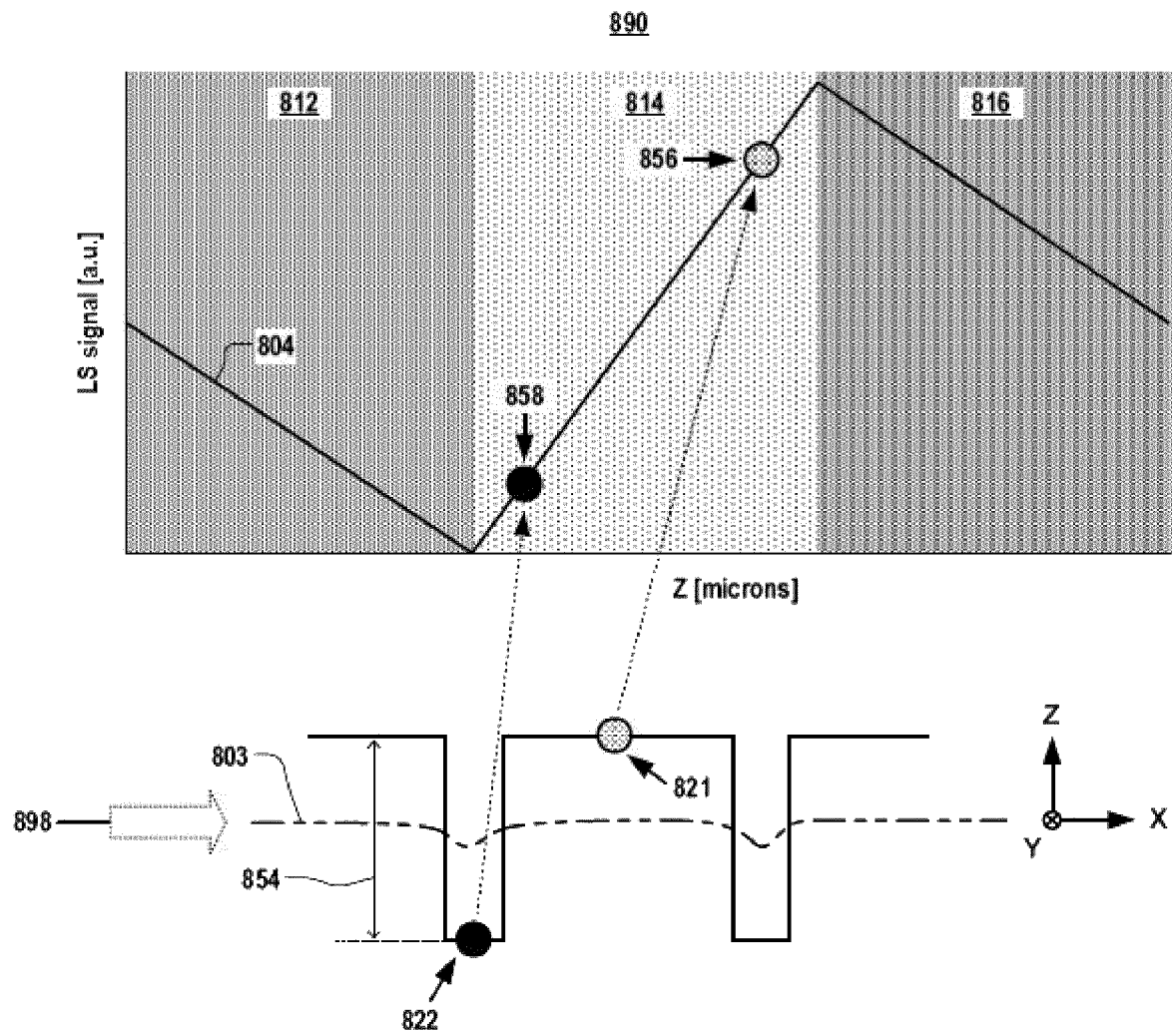

FIGS. 6A and 6B illustrate example height measurement data 800 and example modified height measurement data 890 according to some aspects of the present disclosure. In some aspects, the methods described herein can be extended by further measuring the level sensor gain around the servo height. In some aspects, the full surface of the field (e.g., including both the memory cells and the peripheries) can be used to determine the level data when the level sensing controller (e.g., level sensing controller 510 shown in FIG. 3; controller 2 shown in FIG. 7A; example computing system 1100 shown in FIG. 9) also stores, or has access to, the level sensor gain.

FIG. 6A illustrates a servo height target 801 of the level sensor (the example level sensor LS shown in FIG. 2; the example level sensor 500, the optional first level sensing device 502, or the second level sensing device 504 shown in FIG. 3; the example system 900 or the height sensing device 3 shown in FIGS. 7A, 7B, 7C, and 7D; a single-chip level sensor; or a combination thereof). As further shown in FIG. 6A, a scan direction of the first level sensing device, the second level sensing device, or both is indicated by arrow 898. As further shown in FIG. 6A, the level sensor gain around the servo height is indicated by a level sensor gain curve 802.

In some aspects, a first surface level measurement value 850 can correspond to a top surface of a memory cell 821. In some aspects, a second surface level measurement value 852 can correspond to a bottom surface of the periphery 822. In some aspects, the height 854 of the memory cell 821 can be indicated by the difference between the first surface level measurement value 850 and the second surface level measurement value 852. For example, the height 854 can be greater than about 15 microns, 50 microns, or any other suitable value.

In some aspects, as shown in FIG. 6A, the level sensor can perform gain-based calibration based on region 812 (e.g., outside the measurement range of the level sensor, "not valid"), region 814 (e.g., within the measurement range of the level sensor, "valid"), and region 816 (e.g., outside the measurement range of the level sensor, "not valid"). For example, the level sensing controller can determine that the first surface level measurement value 850 falls within region 814 and, as a result, determine that the first surface level measurement value 850 is "valid." In another example, the level sensing controller can determine that the second surface level measurement value 852 falls within region 812 and, as a result, determine that the second surface level measurement value 852 is "not valid."

In some aspects, there can be insufficient or unexpected level sensor gain on specific locations. In such aspects, the level sensing controller can invalidate these specific locations having insufficient level sensor gain. For example, the level sensing controller can measure the gain, at different locations with the field, at different servo heights. Subsequently, the level sensing controller can determine at which servo height the gain is valid. In some aspects, the level sensing controller can determine at which servo heights the level sensor generates a trustworthy signal by, for example, using gain as a measure of trust.

In one illustrative example, the level sensing controller can calculate the gain in all fieldpoints (e.g., including both the cell and the periphery) by performing scans on different heights. The level sensing controller then can determine whether each calculated gain is "as expected" at each specific height. If a gain is "as expected," the level sensing controller can further determine that the specific height measurement is valid. If a gain is "not as expected" (e.g., insufficient level sensor gain), the level sensing controller can further determine that the specific height measurement is not valid. In other words, when there is insufficient level sensor gain on specific locations, the level sensing controller can invalidate these locations, modify the servo height target such that there is sufficient gain over the full field, or both. For example, as shown in FIG. 6B, the level sensing controller can modify the servo height target 801 such that there is sufficient gain over the full field (e.g., in contrast to FIG. 6A where only half of the range is available).

In some aspects, the level sensing controller can measure the level sensor gain around the servo height. For example, the level sensing controller can calculate the gain in all fieldpoints by performing scans on different heights and determining whether each calculated gain is "as expected" at each specific height. If a gain is "as expected," the level sensing controller can determine that the specific height measurement is valid. If a gain is "not as expected," the level sensing controller can determine that the specific height measurement is not valid. As a result, the level sensing controller can increase the range of the level sensor by, for example, overcoming the periodicity of the level sensor.

FIG. 6B illustrates a modified servo height target 803 of the first level sensing device, the second level sensing device, or both. In some aspects, as shown in FIG. 6B, the modified servo height target 803 can be between the top surface of the memory cell 821 and the bottom surface of the periphery 822. As further shown in FIG. 6B, the level sensor gain around the servo height is indicated by a level sensor gain curve 804.

In some aspects, a third surface level measurement value 856 can correspond to a top surface of the memory cell 821. In some aspects, a fourth surface level measurement value 858 can correspond to a bottom surface of the periphery 822. In some aspects, the height 854 of the memory cell 821 can be indicated by the difference between the third surface level measurement value 856 and the fourth surface level measurement value 858.

In some aspects, as shown in FIG. 6B, the level sensor can perform gain-based calibration based on region 812, region 814, and region 816. For example, the level sensing controller can determine that the third surface level measurement value 856 falls within region 814 and, as a result, determine that the third surface level measurement value 856 is "valid." In another example, the level sensing controller can determine that the fourth surface level measurement value 858 also falls within region 814 and, as a result, determine that the fourth surface level measurement value 858 is also "valid."

FIGS. 7A, 7B, 7C, and 7D are illustrations of additional example level sensors, substrates, data environments, and height measurement data according to some aspects of the present disclosure. Additionally or alternatively, in some aspects, the example level sensors, substrates, data environments, and height measurement data shown in FIGS. 7A, 7B, 7C, and 7D can include any of the structures, techniques, methods, data, or features described with reference to FIGS. 2-6 above and FIGS. 8-9 below, or any combination thereof. In some aspects, FIGS. 7C and 7D can include any of the structures, techniques, methods, data, or features described with reference to FIGS. 6A and 6B, respectively.

Figure 7A:
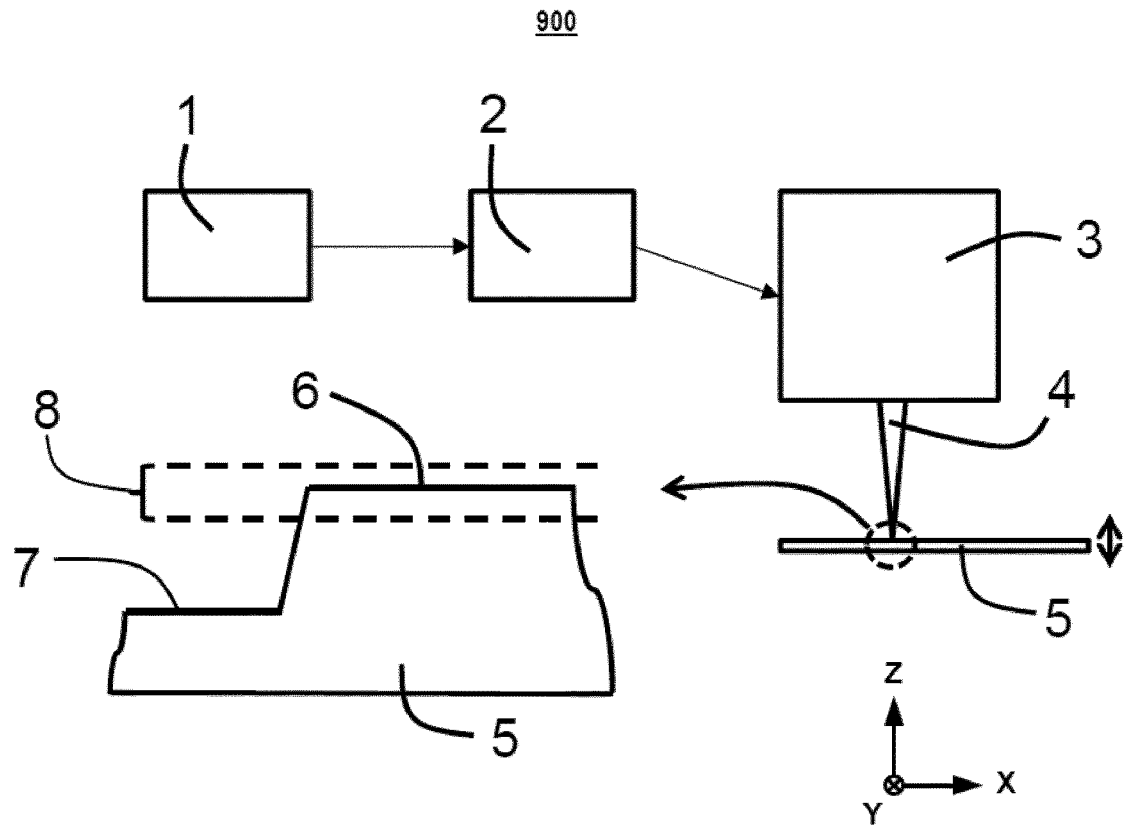
FIGS. 7A, 7B, 7C, and 7D are illustrations of other example level sensors, substrates, data environments, and height measurement data according to some aspects of the present disclosure.

FIG. 7A shows an example system 900 that includes, in some aspects, a controller 2 and a height sensing device 3. The controller 2 can be configured to receive first data 1 (e.g., first level data) for a first region of a substrate 5. The first region can include: a first subregion 6 (e.g., a critical area, an area of interest, a memory cell) having a first surface level; and a second subregion 7 (e.g., a non-critical area, a periphery, a trench) having a second surface level. The controller 2 can be further configured to generate a measurement control map based on the first data 1. The controller 2 can be further configured to control a height measurement of the height sensing device 3 based on the measurement control map. The height sensing device 3 can have a measurement range 8 (e.g., a linear range disposed along the Z-axis), and the substrate 5 can be within the measurement range 8. The height sensing device 3 can be configured to perform the height measurement using measurement radiation 4. The focal point of the measurement radiation 4 can be at about the surface of the first subregion 6 to provide the measurement range 8. The height sensing device 3 can be further configured to generate a second data (e.g., second level data) for a second region of the substrate 5, where the second region includes a plurality of third subregions, where each of the plurality of third subregions has a third surface level equal to about the first surface level of the first subregion 6 arranged within the measurement range 8.

Figure 7B:
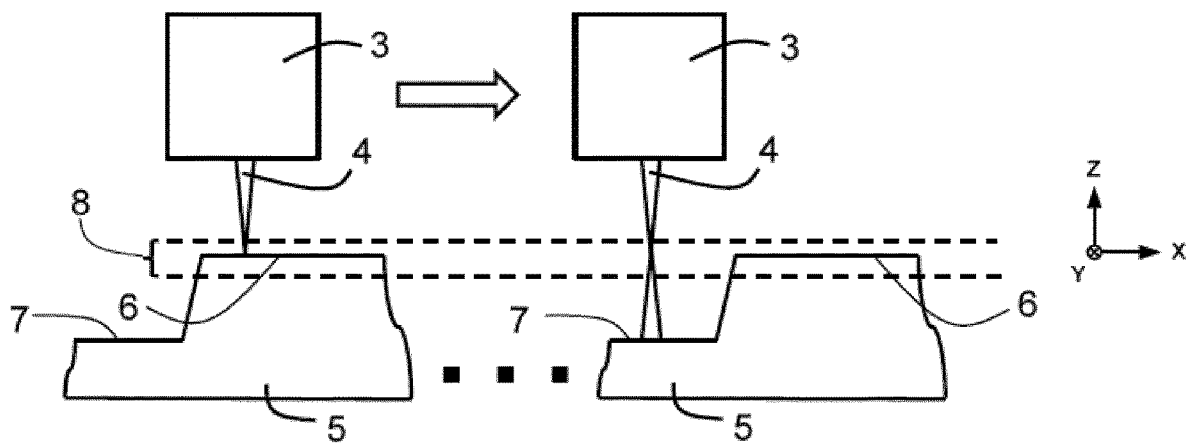

As shown in FIG. 7B, the first subregion 6 is within the measurement range 8 of the height sensing device 3 and the measurement radiation 4 is in focus at about the first surface level of the first subregion 6. As the height sensing device 3 continues to scan the substrate 5, it progresses from the first subregion 6 to the second subregion 7. However, when encountering the second subregion 7, the controller 2 can instruct (e.g., via a servo control signal generated based on the measurement control map) the substrate table not to move up to follow the surface topography of the substrate 5 during the measurement of the second subregion 7 (e.g., by deactivating servo control during the measurement of that non-critical region). Alternatively, the controller 2 can purposefully not instruct (e.g., by a determination to not transmit a servo control signal based on the measurement control map) the substrate table to move up to follow the surface topography of the substrate 5 during the measurement of the second subregion 7. As a result, the second subregion 7 is outside the measurement range 8 of the height sensing device 3 and the measurement radiation 4 is out of focus at about the second surface level of the second subregion 7. Therefore, the substrate 5 remains at about the same level during the measurement scan (e.g., the substrate 5 is not moved upwards to bring the second subregion 7 within the measurement range 8), resulting in a reduction in measurement faults and an increase in measurement speed and accuracy for the regions of interest (e.g., by ignoring or bypassing the second subregion 7).

Figure 7C:
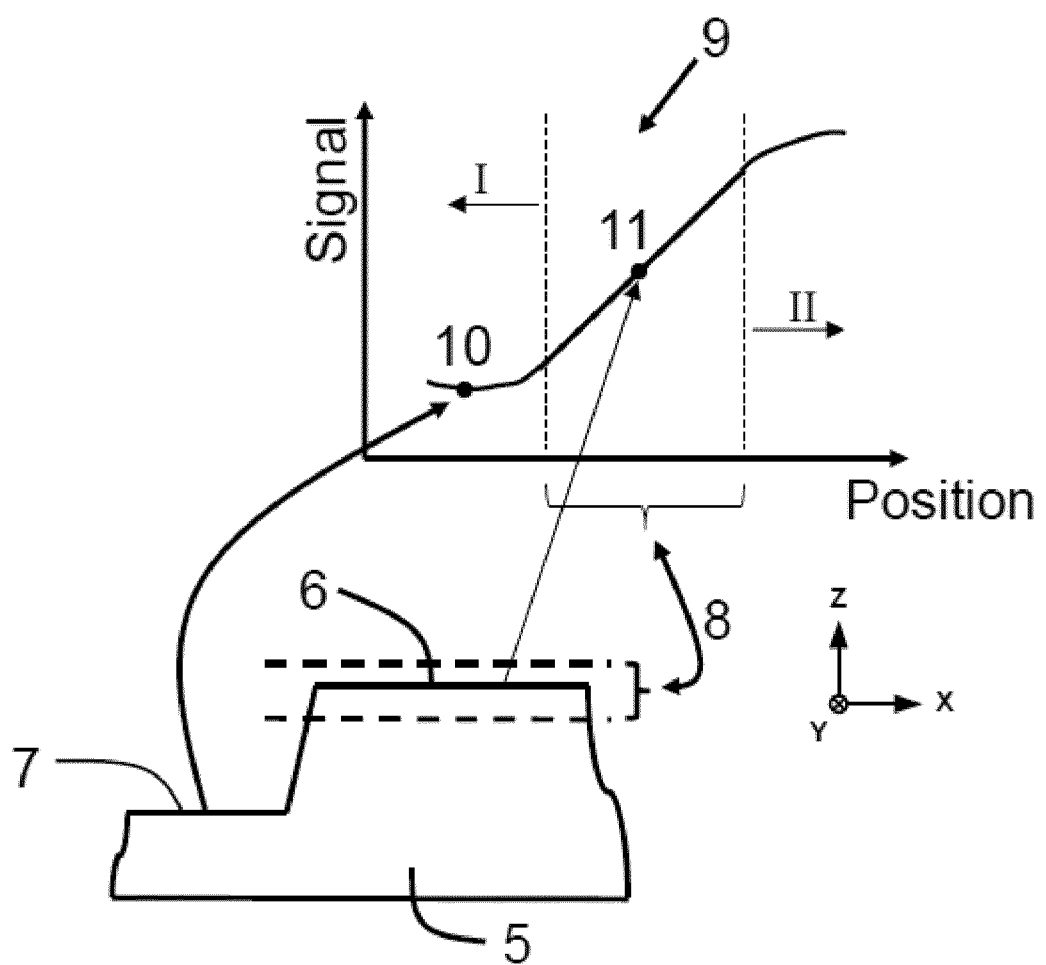

As shown in FIG. 7C, measurement of the substrate 5 by the height sensing device 3 results in, for example, a periodic signal 9 that includes a measurement 10 in the second subregion 7 and a measurement 11 in the first subregion 6. The measurement 10 falls within region I, which is outside measurement range 8 (e.g., within a non-linear portion of the periodic signal 9 that is outside the linear portion of the periodic signal 9). Region II is also outside measurement range 8. The measurement 11 falls within measurement range 8 as indicated by the linear portion of the periodic signal 9 (e.g., between regions I and II).

In some aspects, when the first subregion 6 is within the measurement range 8 of the height sensing device 3, the height sensing device 3 measures changes in the relative distance between the height sensing device 3 and the substrate 5 within the linear portion of the periodic signal 9, in which there is a one-to-one relationship (e.g., gain=1) between the measurement signal of the height sensing device 3 and the position of the substrate 5. In some aspects, when the second subregion 7 is outside the measurement range 8 of the height sensing device 3, the height sensing device 3 measures changes in the relative distance between the height sensing device 3 and the substrate 5 within the non-linear regions I and II, within the non-linear portion of the periodic signal 9 (e.g., region I), in which there is not a one-to-one relationship (e.g., gain≠1) between the measurement signal of the height sensing device 3 and the position of the substrate 5. Accordingly, in some aspects, the height sensing device 3 measures those changes in the relative distance incorrectly or not at all. In this way, the controller 2 can determine valid and non-valid servo positions for every (x,y) position of the substrate 5.

In some aspects, the controller 2 can determine the regions I and II based on the first data 1. In some aspects, because the regions I and II are out of range of the height sensing device 3, the controller 2 can ignore servo settings or invalidate measurements within those regions. In some aspects, the controller 2 can generate, based on the first data 1 and/or the regions I and II, servo control signals configured to keep the measurements of the first subregion 6 within the center of the linear portion of the periodic signal 9 (e.g., the center of the measurement range 8), where there is a one-to-one relationship between measurement signal and substrate table position.

Figure 7D:
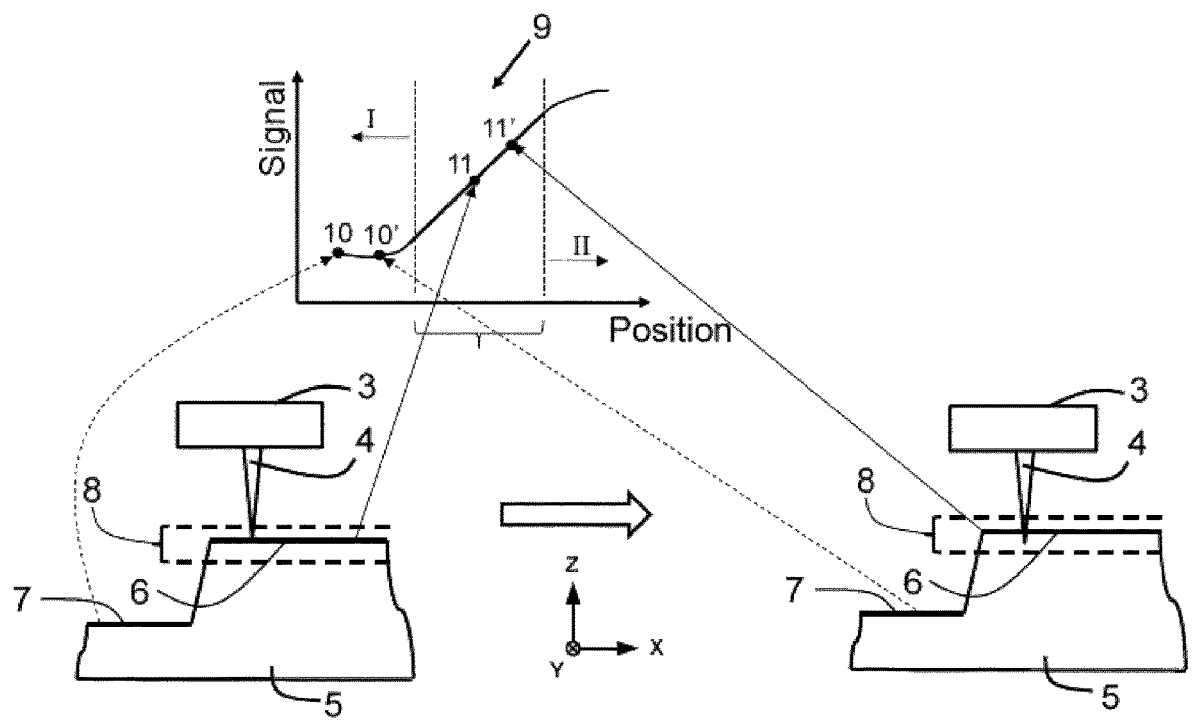

FIG. 7D illustrates gain-based validity calibration by adjusting the relative distance between height sensing device 3 and substrate 5 as indicated by the arrow pointing from the height sensing device 3 on the left-hand side of FIG. 7D to the height sensing device 3 on the right-hand side of FIG. 7D. With respect to the height sensing device 3 on the left-hand side of FIG. 7D, the focal point of the measurement radiation 4 is at the surface of the first subregion 6 and within the measurement range 8. With respect to the height sensing device 3 on the right-hand side of FIG. 7D, the substrate 5 has been moved up by a servo offset amount and the focal point of the measurement radiation 4 is below the surface of the first subregion 6 but still within the measurement range 8. In some aspects, the relative distance between height sensing device 3 and substrate 5 can be adjusted by applying a bias to the servo (e.g., for all measurement points) in order to move the substrate table holding substrate 5 up by a servo offset amount (e.g., one-half of the measurement range 8, or any other suitable distance). Accordingly, the substrate 5 is moved closer to the height sensing device 3 by the servo offset amount, resulting in the focal point of the measurement radiation 4 falling just under the surface of the first subregion 6 (e.g., rather than at the surface of the first subregion 6). As a result of the application of the bias to the servo, the measurement 10' falls within region I, which is outside measurement range 8 but closer to the linear portion of the periodic signal 9 than the measurement 10. The measurement 11' falls within measurement range 8 as indicated by the linear portion of the periodic signal 9 but further along the linear portion of the periodic signal 9 than the measurement 11.

In some aspects, the controller 2 can select the second subregion 7 to be in the focal plane (e.g., within the measurement range 8 and the linear portion of the periodic signal 9) of the height sensing device 3. In some aspects (e.g., as described with reference to FIG. 6B), the controller 2 can select both the first subregion 6 and the second subregion 7 to be in the focal plane of the height sensing device 3 (e.g., for skyscraper architectures having a lower height difference between the first subregion 6 and the second subregion 7). In some aspects, the controller 2 can apply the techniques described herein to a multi-level substrate having three or more levels. For example, in a four level substrate where the top two layers are regions of interest, the controller can select the top two surfaces to be in the focal plane of the height sensing device 3, and the bottom two surfaces can fall outside of the focal plane of the height sensing device 3.

Example Processes for Generating Level Data

Figure 8:
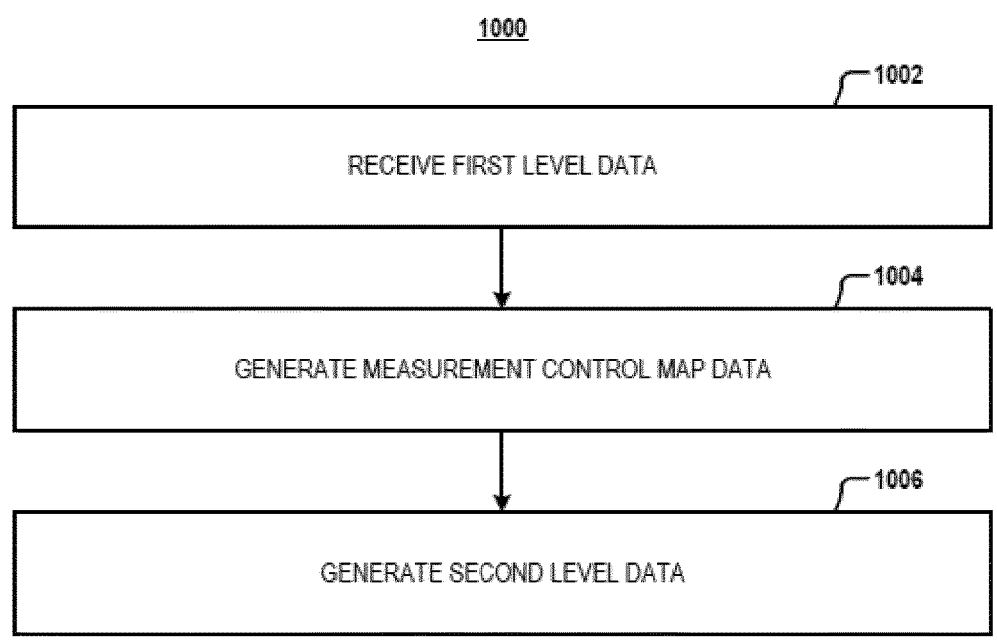
FIG. 8 is an example method for generating level data according to some aspects of the present disclosure or portion(s) thereof.

FIG. 8 is an example method 1000 for generating level data according to some aspects of the present disclosure or portion(s) thereof. The operations described with reference to example method 1000 can be performed by, or according to, any of the systems, apparatuses, components, techniques, or combinations thereof described herein, such as those described with reference to FIGS. 1-7 above and FIG. 9 below.

At operation 1002, the method can include receiving, by a level sensing controller (e.g., level sensing controller 510 shown in FIG. 3; controller 2 shown in FIG. 7A; example computing system 1100 shown in FIG. 9), first level data (e.g., first level data 610 shown in FIG. 4) for a first region (e.g., one or more of the first regions 604A, 604B, 604C, 604D, and 604E shown in FIG. 4, or an average region based thereon) of a substrate (e.g., substrate W shown in FIGS. 1 and 2; substrate 602 shown in FIG. 4; substrate 740 shown in FIG. 5A; substrate 5 shown in FIGS. 7A, 7B, 7C, and 7D). In some aspects, the first region can include a first subregion (e.g., one of the plurality of first subregions 614A, 614B, through 614N shown in FIG. 4; first subregion 6 shown in FIGS. 7A, 7B, 7C, and 7D) having a first surface level (e.g., the first surface level 750 shown in FIGS. 5A and 5C), and a second subregion (e.g., one of the plurality of second subregions 612A, 612B, through 612N shown in FIG. 4; second subregion 7 shown in FIGS. 7A, 7B, 7C, and 7D) having a second surface level (e.g., the second surface level 752 shown in FIGS. 5A and 5C). In some aspects, the level sensing controller can receive the first level data by receiving design layout data that includes the first level data and extracting the first level data from the received design layout data. In some aspects, the level sensing controller can receive the first level data by receiving design layout data generating the first level data based on the received design layout data. In some aspects, the design layout data can include a GDS data file. In some aspects, the level sensing controller can receive, directly or indirectly, the first level data from a first level sensing device (e.g., one or more portions of the example level sensor LS shown in FIG. 2, the optional first level sensing device 502 shown in FIG. 3, the height sensing device 3 shown in FIGS. 7A, 7B, 7C, and 7D or a combination thereof) that generated the first level data and transmitted, directly or indirectly, the first level data to the level sensing controller. In some aspects, the receipt of the first level data can be accomplished using suitable mechanical or other methods and include receiving the first level data in accordance with any aspect or combination of aspects described with reference to FIGS. 1-7 above and FIG. 9 below.

At operation 1004, the method can include generating, by the level sensing controller and based on the first level data, measurement control map data (e.g., measurement control map data 620 shown in FIG. 4). In some aspects, the measurement control map data can include a servo offset map (x,y), a validity map (x,y), or a combination servo offset and validity map (x,y). In some aspects, the generation of the measurement control map data can be accomplished using suitable mechanical or other methods and include generating the measurement control map data in accordance with any aspect or combination of aspects described with reference to FIGS. 1-7 above and FIG. 9 below.

At operation 1006, the method can include generating, by a second level sensing device (e.g., one or more portions of the example level sensor LS shown in FIG. 2; the second level sensing device 504 shown in FIG. 3; the height sensing device 3 shown in FIGS. 7A, 7B, 7C, and 7D; or a combination thereof) and based on the measurement control map data, second level data (e.g., second level data 630 shown in FIG. 4) for a second region of the substrate. In some aspects, the second region can include a plurality of third subregions (e.g., the plurality of third subregions 634A, 634B, through 634N shown in FIG. 4) each having a third surface level equal to about the first surface level. Optionally, in some aspects, the second region can include no region having a surface level equal to about the second surface level. In some aspects, the generation of the second level data can be accomplished using suitable mechanical or other methods and include generating the second level data in accordance with any aspect or combination of aspects described with reference to FIGS. 1-7 above and FIG. 9 below.

Example Computing System

Aspects of the disclosure can be implemented in hardware, firmware, software, or any combination thereof. Aspects of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical, or other forms of propagated signals (e.g., carrier waves, infrared signals, digital signals, etc.), and others. Further, firmware, software, routines, instructions, and combinations thereof can be described herein as performing certain actions. However, it should be appreciated that such descriptions are merely for convenience and that such actions in fact result from computing devices, processors, controllers, or other devices executing the firmware, software, routines, instructions, or combinations thereof and, in doing so, causing actuators or other devices (e.g., servo motors, robotic devices) to interact with the physical world.

Various aspects can be implemented, for example, using one or more computing systems, such as example computing system 1100 shown in FIG. 9. Example computing system 1100 can be a specialized computer capable of performing the functions described herein such as: the example level sensor LS described with reference to FIG. 2; the example level sensor 500, the level sensing controller 510, or both described with reference to FIG. 3; the example system 900, controller 2, height sensing device 3, or a combination thereof shown in FIGS. 7A, 7B, 7C, and 7D; a single-chip level sensor; any other suitable system, sub-system, or component; or any combination thereof. Example computing system 1100 can include one or more processors (also called central processing units, or CPUs), such as a processor 1104. Processor 1104 is connected to a communication infrastructure 1106 (e.g., a bus). Example computing system 1100 can also include user input/output device(s) 1103, such as monitors, keyboards, pointing devices, etc., that communicate with communication infrastructure 1106 through user input/output interface(s) 1102. Example computing system 1100 can also include a main memory 1108 (e.g., one or more primary storage devices), such as random access memory (RAM). Main memory 1108 can include one or more levels of cache. Main memory 1108 has stored therein control logic (e.g., computer software) and/or data.

Example computing system 1100 can also include a secondary memory 1110 (e.g., one or more secondary storage devices). Secondary memory 1110 can include, for example, a hard disk drive 1112 and/or a removable storage drive 1114. Removable storage drive 1114 can be a floppy disk drive, a magnetic tape drive, a compact disk drive, an optical storage device, tape backup device, and/or any other storage device/drive.

Removable storage drive 1114 can interact with a removable storage unit 1118. Removable storage unit 1118 includes a computer usable or readable storage device having stored thereon computer software (control logic) and/or data. Removable storage unit 1118 can be a floppy disk, magnetic tape, compact disk, DVD, optical storage disk, and/or any other computer data storage device. Removable storage drive 1114 reads from and/or writes to removable storage unit 1118.

According to some aspects, secondary memory 1110 can include other means, instrumentalities or other approaches for allowing computer programs and/or other instructions and/or data to be accessed by example computing system

1100. Such means, instrumentalities or other approaches can include, for example, a removable storage unit 1122 and an interface 1120. Examples of the removable storage unit 1122 and the interface 1120 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Example computing system 1100 can further include a communications interface 1124 (e.g., one or more network interfaces). Communications interface 1124 enables example computing system 1100 to communicate and interact with any combination of remote devices, remote networks, remote entities, etc. (individually and collectively referred to as remote devices 1128). For example, communications interface 1124 can allow example computing system 1100 to communicate with remote devices 1128 over communications path 1126, which can be wired and/or wireless, and which can include any combination of LANs, WANs, the Internet, etc. Control logic, data, or both can be transmitted to and from example computing system 1100 via communications path 1126.

The operations in the preceding aspects of the present disclosure can be implemented in a wide variety of configurations and architectures. Therefore, some or all of the operations in the preceding aspects can be performed in hardware, in software or both. In some aspects, a tangible, non-transitory apparatus or article of manufacture includes a tangible, non-transitory computer useable or readable medium having control logic (software) stored thereon is also referred to herein as a computer program product or program storage device. This includes, but is not limited to, example computing system 1100, main memory 1108, secondary memory 1110 and removable storage units 1118 and 1122, as well as tangible articles of manufacture embodying any combination of the foregoing. Such control logic, when executed by one or more data processing devices (such as example computing system 1100), causes such data processing devices to operate as described herein.

Based on the teachings contained in this disclosure, it will be apparent to persons skilled in the relevant art(s) how to make and use aspects of the disclosure using data processing devices, computer systems and/or computer architectures other than that shown in FIG. 9. In particular, aspects of the disclosure can operate with software, hardware, and/or operating system implementations other than those described herein.

Although specific reference may be made in this text to the use of lithographic apparatus in the manufacture of ICs, it should be understood that the lithographic apparatuses described herein can have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself can be patterned and materials added on top of it can also be patterned, or can remain without patterning.

The examples disclosed herein are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific aspects of the disclosure have been described above, it will be appreciated that the aspects can be practiced otherwise than as described. The description is not intended to limit the embodiments of the disclosure.

It is to be appreciated that the Detailed Description section, and not the Background, Summary, and Abstract sections, is intended to be used to interpret the claims. The Summary and Abstract sections may set forth one or more but not all example embodiments as contemplated by the inventor(s), and thus, are not intended to limit the present embodiments and the appended claims in any way.

Some aspects of the disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects of the disclosure will so fully reveal the general nature of the aspects that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein.

Aspects of the invention are set out in the clauses below.

1. A system, comprising a level sensing controller configured to: receive first level data for a first region of a substrate, generate measurement control map data based on the first level data; and a second level sensing device configured to generate, based on the measurement control map data, second level data for a second region of the substrate, wherein: the first region comprises: a first subregion having a first surface level; and a second subregion having a second surface level; and the second region comprises: a plurality of third subregions each having a third surface level equal to about the first surface level.

2. The system of clause 1, wherein the level sensing controller is configured to receive design layout data comprising the first level data.

3. The system of clause 2, wherein the design layout data comprises a Graphic Data System (GDS) data file.

4. The system of clause 1, wherein: the system further comprises a first level sensing device; the first level sensing device is configured to: generate the first level data; and transmit the first level data; and the level sensing controller is configured to receive the first level data from the first level sensing device.

5. The system of clause 4, wherein: the first level sensing device is further configured to generate the first level data at a first resolution; the second level sensing device is further configured to generate the second level data at a second resolution; and the second resolution is higher than the first resolution.

6. The system of clause 4, wherein: the first level sensing device comprises a visible spectrum sensor; and the second level sensing device comprises an ultraviolet spectrum sensor.

7. The system of clause 1, wherein the level sensing controller is configured to generate the measurement control map data based on an application of a first weighting value to the first subregion and a second weighting value to the second subregion.

8. The system of clause 7, wherein: the first weighting value is about one; and the second weighting value is about zero.

9. The system of clause 1, wherein the level sensing controller is configured to: generate first topographic map data based on the first level data; and generate second topographic map data based on the second level data, wherein the second topographic map data is different from the first topographic map data.

10. The system of clause 1, wherein: the level sensing controller is configured to generate a servo control signal based on the measurement control map data; and the servo control signal is configured to instruct the second level sensing device to: follow a topography of the substrate at about the third surface level; and keep the third surface level within a measurement range of the second level sensing device during a measurement process.

11. The system of clause 10, wherein the servo control signal is configured to instruct the second level sensing device to modify a servo height target.

12. The system of clause 11, wherein the servo control signal is configured to instruct the second level sensing device to modify the servo height target to be between the first surface level and the second surface level.

13. An apparatus, comprising: a level sensing controller configured to: receive first level data for a first region of a substrate; and generate measurement control map data based on the first level data; and a second level sensing device configured to generate, based on the measurement control map data, second level data for a second region of the substrate, wherein: the first region comprises: a first subregion having a first surface level; and a second subregion having a second surface level; and the second region comprises: a plurality of third subregions each having a third surface level equal to about the first surface level.

14. A method, comprising: receiving, by a level sensing controller, first level data for a first region of a substrate, wherein the first region comprises: a first subregion having a first surface level; and a second subregion having a second surface level; generating, by the level sensing controller and based on the first level data, measurement control map data; and generating, by a second level sensing device and based on the measurement control map data, second level data for a second region of the substrate, wherein the second region comprises: a plurality of third subregions each having a third surface level equal to about the first surface level.

15. The method of clause 14, further comprising receiving, by the level sensing controller, design layout data comprising the first level data.

16. The method of clause 14, further comprising generating, by a first level sensing device, the first level data.

17. The method of clause 14, further comprising generating, by the level sensing controller, the measurement control map data based on an application of a first weighting value to the first subregion and a second weighting value to the second subregion.

18. The method of clause 14, further comprising: generating, by the level sensing controller, first topographic map data based on the first level data; and generating, by the level sensing controller, second topographic map data based on the second level data, wherein the second topographic map data is different from the first topographic map data.

19. The method of clause 14, further comprising: generating, by level sensing controller, a servo control signal based on the measurement control map data; following, by the second level sensing device and based on the servo control signal, a topography of the substrate at about the third surface level; and keeping, by the second level sensing device and based on the servo control signal, the third surface level within a measurement range during a measurement process.

20. The method of clause 19, further comprising modifying, by the second level sensing device and based on the servo control signal, a servo height target to between the first surface level and the second surface level.

The breadth and scope of the present disclosure should not be limited by any of the above-described example aspects or embodiments, but should be defined only in accordance with the following claims and their equivalents.

The invention claimed is:

1. A system, comprising:
a level sensing controller configured to:
receive first level data for a first region of a substrate, and
generate measurement control map data based on the first level data; and
a second level sensing device configured to generate, based on the measurement control map data, second level data for a second region of the substrate,
wherein:
the first region comprises:
a first subregion having a first surface level; and
a second subregion having a second surface level; and
the second region comprises:
a plurality of third subregions each having a third surface level located equal to about the first surface level; and
wherein the level sensing controller is configured to generate the measurement control map data based on an application of a first weighting value to the first subregion and a second weighting value to the second subregion.

2. The system of claim 1, wherein the level sensing controller is configured to receive design layout data comprising the first level data.

3. The system of claim 2, wherein the design layout data comprises a Graphic Data System (GDS) data file.

4. The system of claim 1, wherein:
the system further comprises a first level sensing device;
the first level sensing device is configured to:
generate the first level data; and
transmit the first level data; and
the level sensing controller is configured to receive the first level data from the first level sensing device.

5. The system of claim 4, wherein:
the first level sensing device is further configured to generate the first level data at a first resolution;
the second level sensing device is further configured to generate the second level data at a second resolution; and
the second resolution is higher than the first resolution.

6. The system of claim 1, wherein:
the first weighting value is about one; and
the second weighting value is about zero.

7. The system of claim 1, wherein the level sensing controller is configured to:
generate first topographic map data based on the first level data; and
generate second topographic map data based on the second level data,
wherein the second topographic map data is different from the first topographic map data.

8. The system of claim 1, wherein:
the level sensing controller is configured to generate a servo control signal based on the measurement control map data; and
the servo control signal is configured to instruct the second level sensing device to:
follow a topography of the substrate at about the third surface level; and
keep the third surface level within a measurement range of the second level sensing device during a measurement process.

9. The system of claim 8, wherein the servo control signal is configured to instruct the second level sensing device to modify a servo height target.

10. The system of claim 9, wherein the servo control signal is configured to instruct the second level sensing device to modify the servo height target to be between the first surface level and the second surface level.

11. An apparatus, comprising:
a level sensing controller configured to:
receive first level data for a first region of a substrate;
generate measurement control map data based on the first level data; and
generate a servo control signal based on the measurement control map data; and
a second level sensing device configured to generate, based on the measurement control map data, second level data for a second region of the substrate,
wherein the first region comprises:
a first subregion having a first surface level; and
a second subregion having a second surface level,
wherein the second region comprises a plurality of third subregions each having a third surface level equal to about the first surface level; and
wherein the second level sensing device, based on the servo control signal, is further configured to generate a topography of the substrate at about the third surface level and to keep the third surface level within a measurement range during a measurement process.

12. A method, comprising:
receiving, by a level sensing controller, first level data for a first region of a substrate, wherein the first region comprises:
a first subregion having a first surface level; and
a second subregion having a second surface level;
generating, by the level sensing controller and based on the first level data, measurement control map data;
generating, by a second level sensing device and based on the measurement control map data, second level data for a second region of the substrate, wherein the second region comprises:
a plurality of third subregions each having a third surface level equal to about the first surface level;
generating, by the level sensing controller, a servo control signal based on the measurement control map data;
following, by the second level sensing device and based on the servo control signal, a topography of the substrate at about the third surface level; and
keeping, by the second level sensing device and based on the servo control signal, the third surface level within a measurement range during a measurement process.

13. The method of claim 12, further comprising receiving, by the level sensing controller, design layout data comprising the first level data.

14. The method of claim 12, further comprising generating, by a first level sensing device, the first level data.

15. The method of claim 12, further comprising:
generating, by the level sensing controller, first topographic map data based on the first level data; and
generating, by the level sensing controller, second topographic map data based on the second level data,
wherein the second topographic map data is different from the first topographic map data.

16. The method of claim 12, further comprising generating, by the level sensing controller, the measurement control map data based on an application of a first weighting value to the first subregion and a second weighting value to the second subregion.

17. The method of claim 12, further comprising modifying, by the second level sensing device and based on the servo control signal, a servo height target to between the first surface level and the second surface level.

* * * * *